United States Patent
Davis

(10) Patent No.: US 9,093,631 B2
(45) Date of Patent: Jul. 28, 2015

(54) PLASMONIC GRAPHENE DEVICES

(71) Applicant: Solan, LLC, Salt Lake City, UT (US)

(72) Inventor: Mark Alan Davis, Springville, UT (US)

(73) Assignee: Solan, LLC, Salt Lake City, UT (US)

(*) Notice: Subject to any disclaimer, the term of this patent is extended or adjusted under 35 U.S.C. 154(b) by 0 days.

(21) Appl. No.: 14/322,718

(22) Filed: Jul. 2, 2014

(65) Prior Publication Data

US 2014/0312307 A1 Oct. 23, 2014

Related U.S. Application Data

(63) Continuation of application No. PCT/US2014/027417, filed on Mar. 14, 2014.

(60) Provisional application No. 61/802,006, filed on Mar. 15, 2013.

(51) Int. Cl.
| | | |
|---|---|---|
| H01L 31/18 | (2006.01) | |
| H01L 49/00 | (2006.01) | |
| H01L 29/16 | (2006.01) | |
| H01L 31/0248 | (2006.01) | |
| H01L 31/028 | (2006.01) | |

(52) U.S. Cl.
CPC .......... *H01L 49/006* (2013.01); *H01L 29/1606* (2013.01); *H01L 31/028* (2013.01); *H01L 31/0248* (2013.01); *H01L 31/18* (2013.01)

(58) Field of Classification Search
CPC . H01L 49/006; H01L 131/18; H01L 131/028; H01L 29/66015; H01L 2924/13088; H01L 29/1606; H01L 29/0669; H01L 51/0048

USPC .......... 257/9, 29, 77, E21.041, E21.135; 977/734, 742; 438/510, 283, 478
See application file for complete search history.

(56) References Cited

U.S. PATENT DOCUMENTS

| | | | |
|---|---|---|---|
| 2007/0218202 A1 | 9/2007 | Ajayan et al. | |
| 2011/0177307 A1* | 7/2011 | Pei | ................. 428/206 |
| 2011/0183105 A1 | 7/2011 | Gamo et al. | |

(Continued)

OTHER PUBLICATIONS

International Search Report for International Patent Application No. PCT/US2014/027417 filed Mar. 14, 2014, 3 pages.

(Continued)

*Primary Examiner* — Selim Ahmed
(74) *Attorney, Agent, or Firm* — Morgan Lewis & Bockius LLP

(57) ABSTRACT

An integrated graphene-based structure comprises an N-dimensional array of elements formed on a surface of a substrate. The N-dimensional array of elements includes a plurality of rows. Each respective row in the plurality of rows comprises a corresponding plurality of elements formed along a first dimension. Each element in the corresponding plurality of elements comprising at least one graphene stack and separated from an adjacent element along the first dimension by a first average spatial separation thereby resulting in a first periodicity in lateral spacing along the first dimension. Each respective row in the plurality of rows is separated from an adjacent row along a second dimension by a second average spatial separation, thereby resulting in a second periodicity in lateral spacing along the second dimension. The N-dimensional array exhibits a set of characteristic electromagnetic interference properties in response to electromagnetic radiation incident on the N-dimensional array.

32 Claims, 25 Drawing Sheets

(56) References Cited

U.S. PATENT DOCUMENTS

| | | |
|---|---|---|
| 2011/0253983 A1 | 10/2011 | Chen et al. |
| 2011/0293884 A1 | 12/2011 | Zhu et al. |
| 2012/0267729 A1 | 10/2012 | Dang et al. |
| 2013/0026441 A1 | 1/2013 | White |
| 2013/0051535 A1 | 2/2013 | Davis et al. |

OTHER PUBLICATIONS

Wu, L. et al., "Highly sensitive graphene biosensors based on surface plasmon resonance," *Optics Express*, Jul. 5, 2010, vol. 18, No. 14, pp. 14395-14400.

* cited by examiner

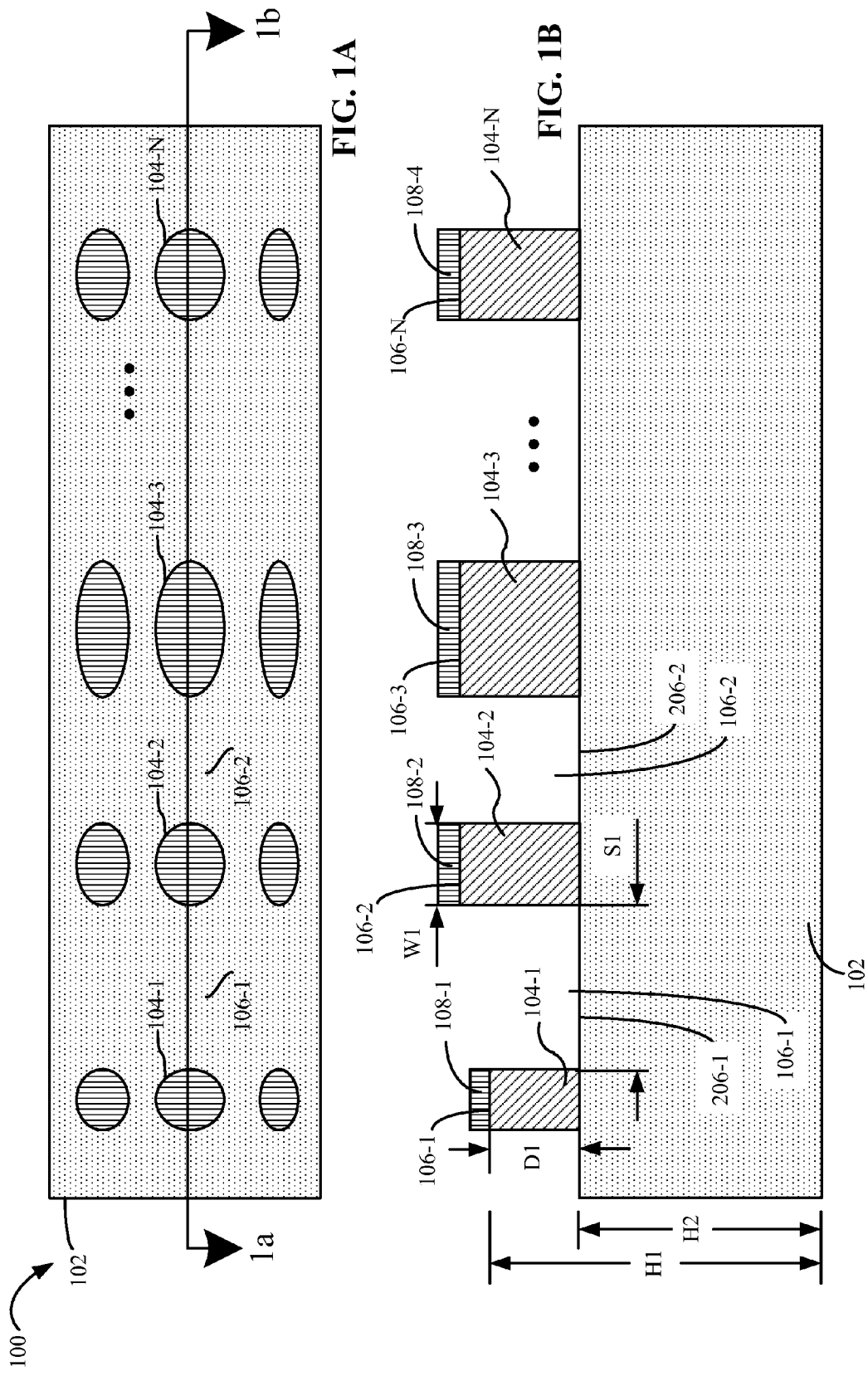

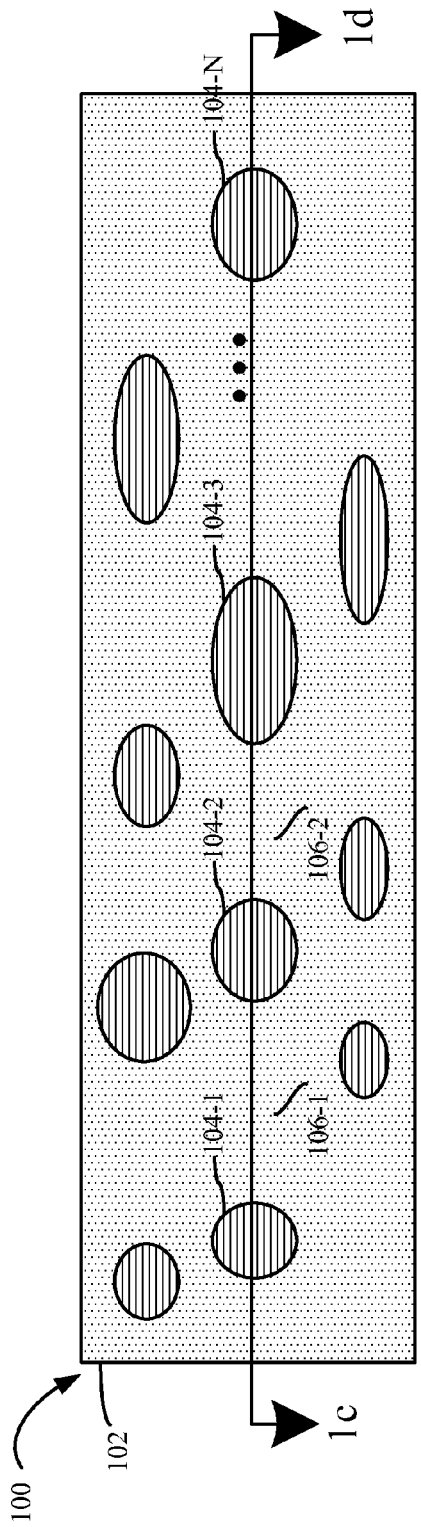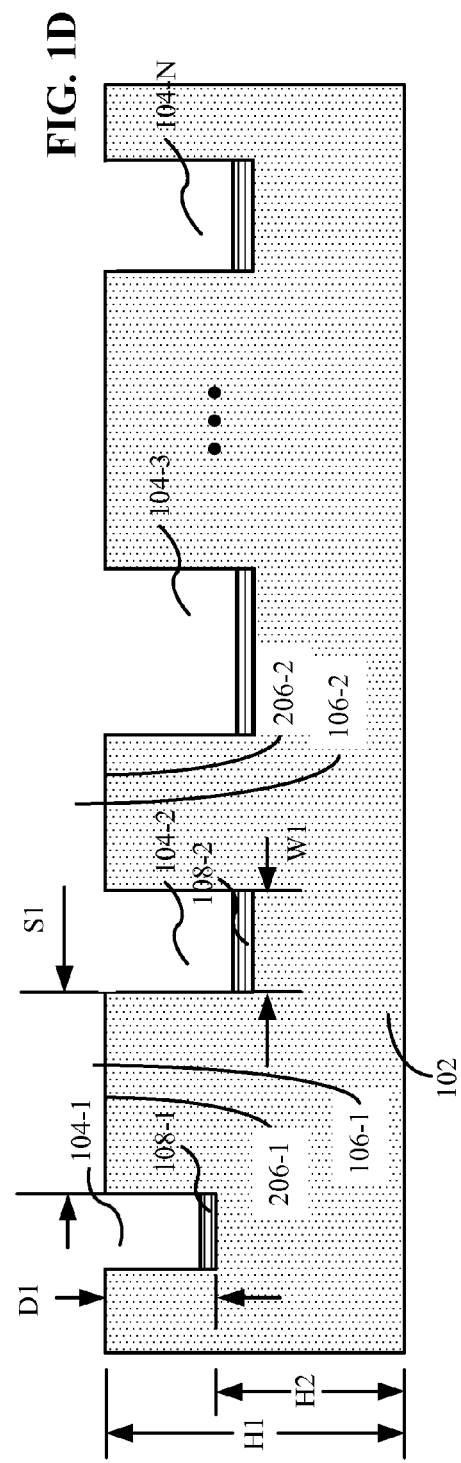

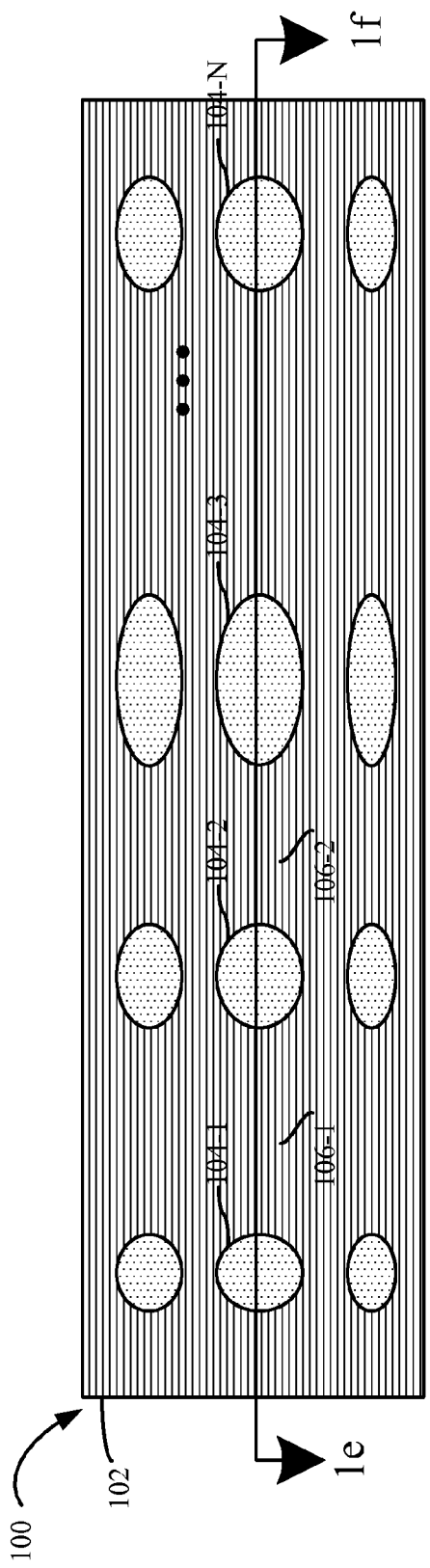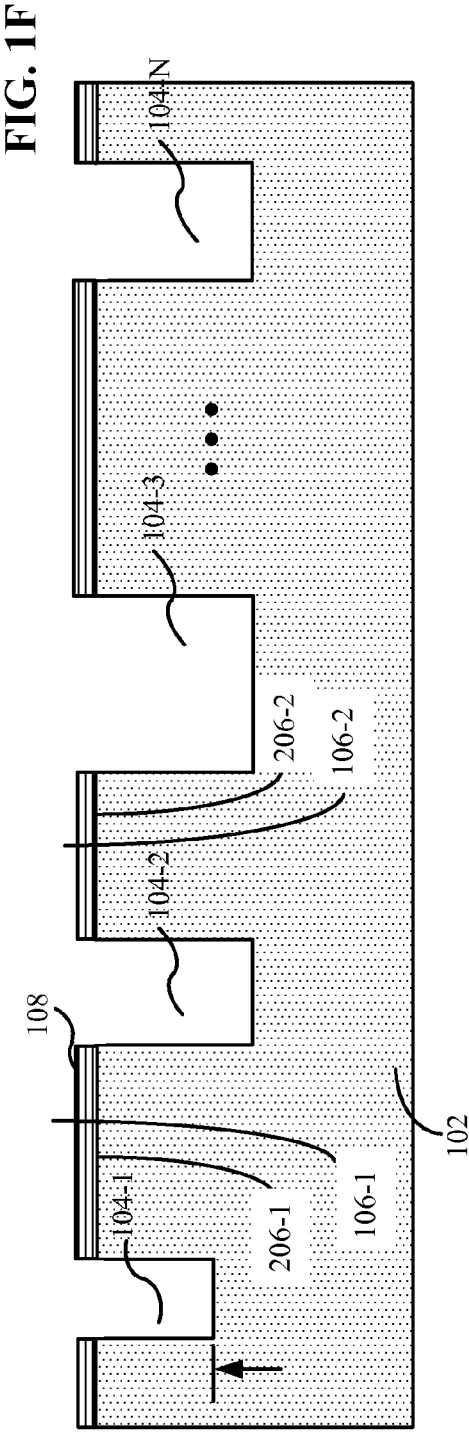

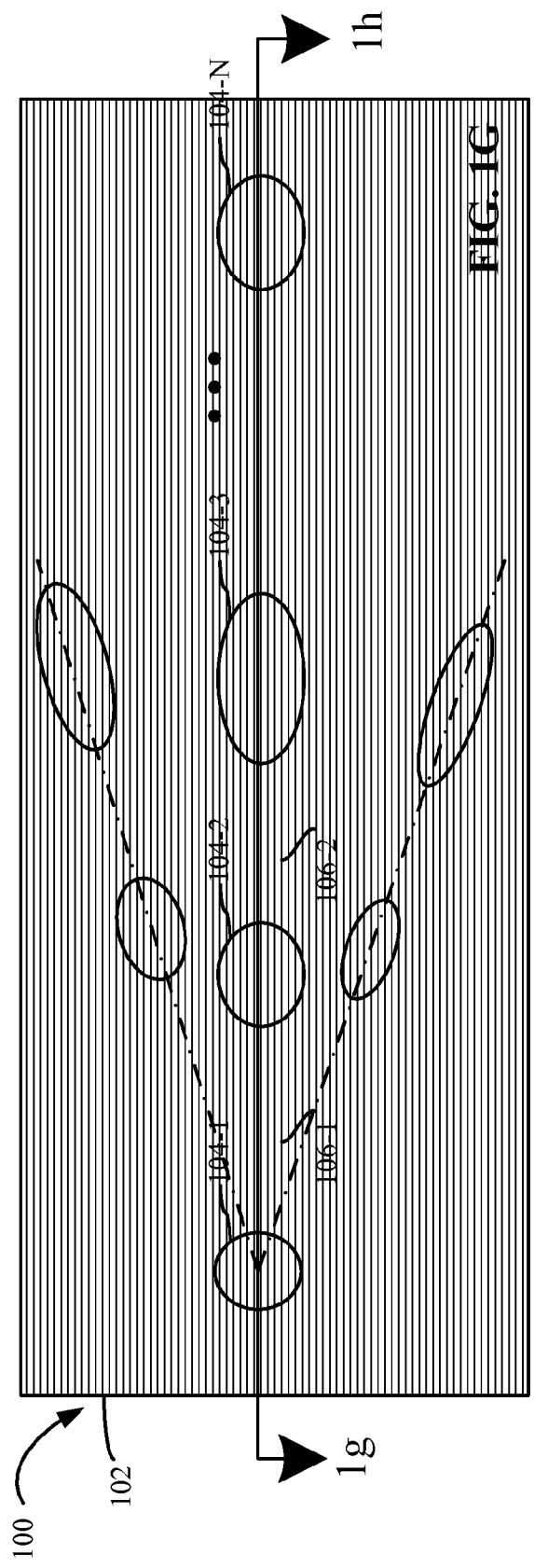
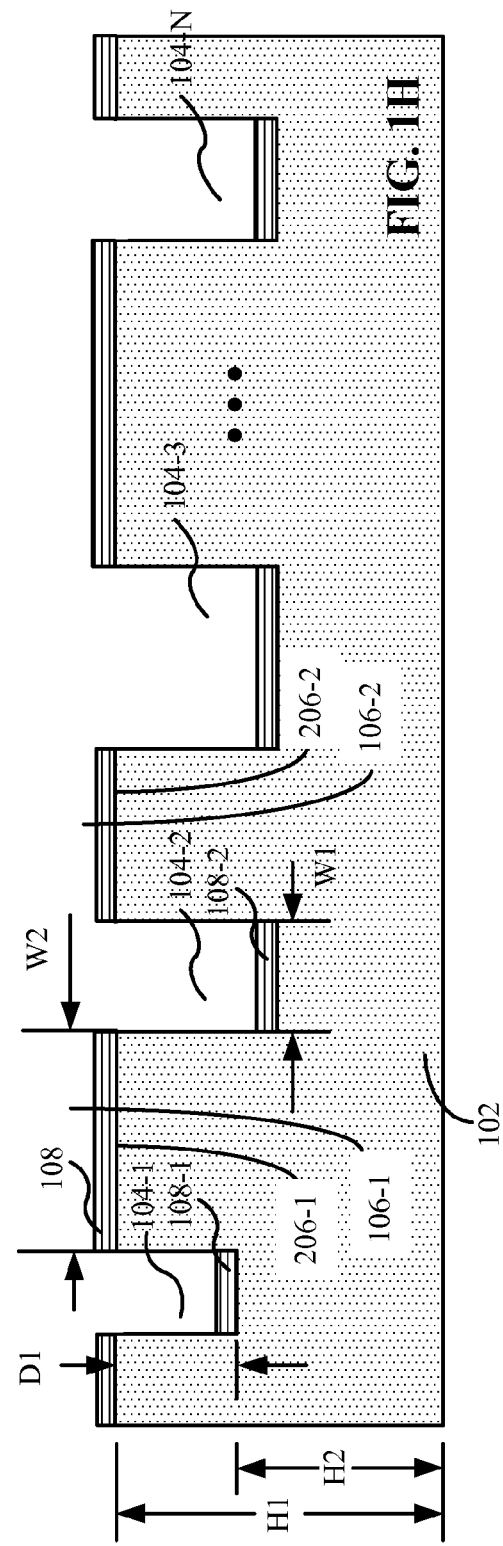

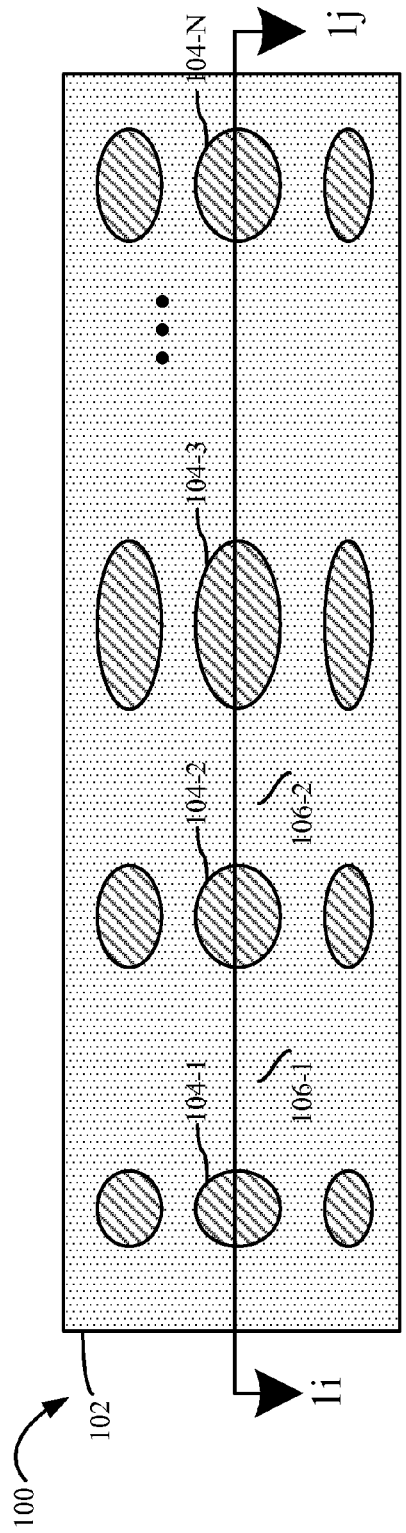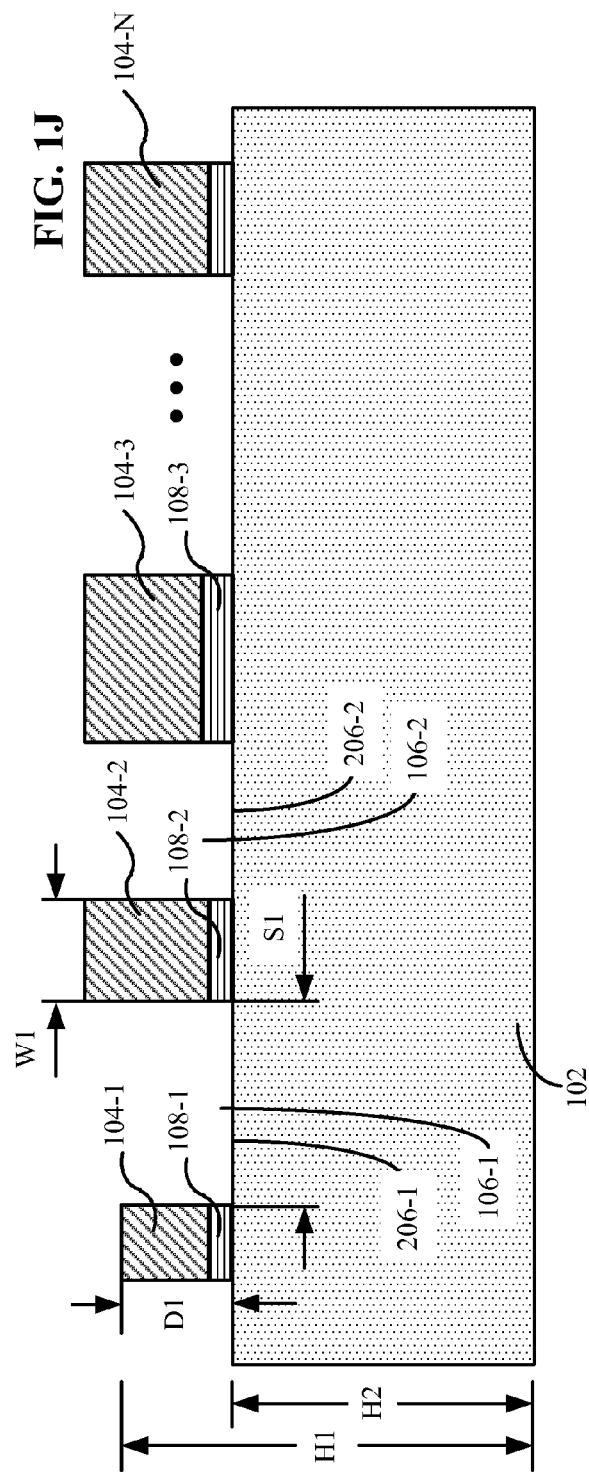

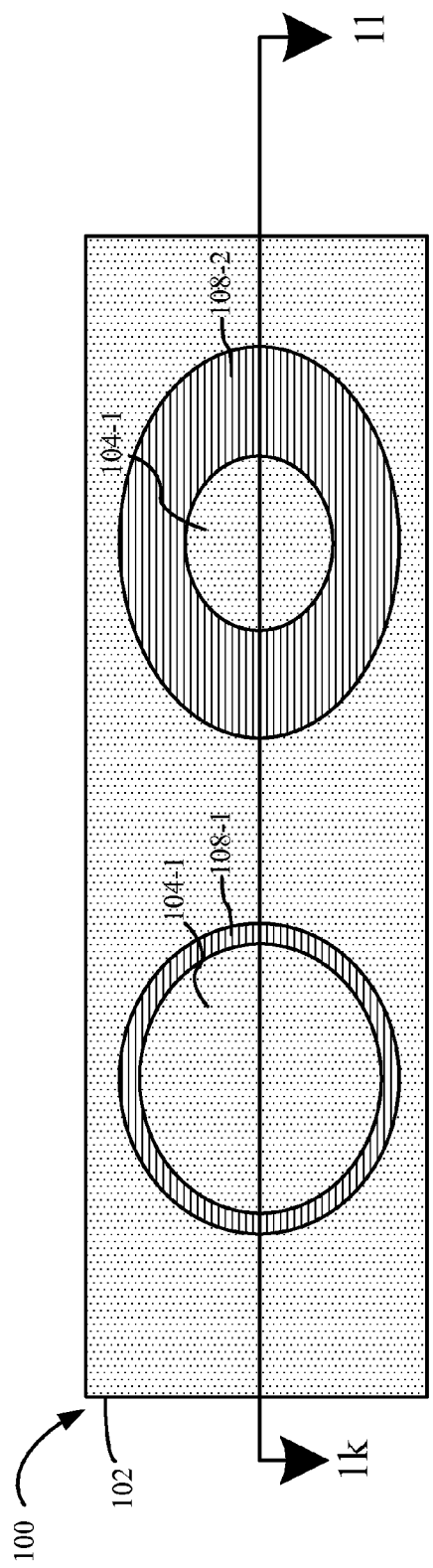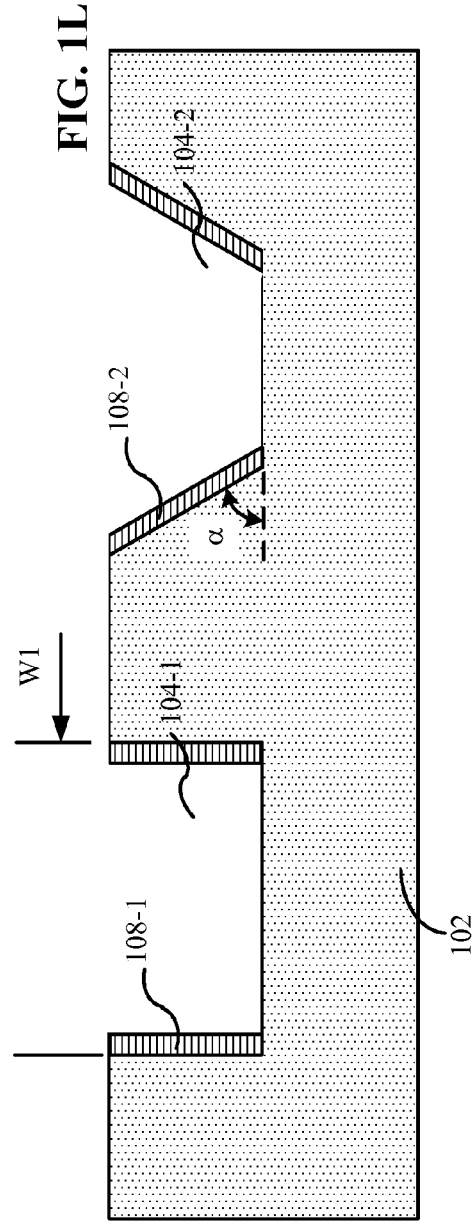
FIG. 1K
FIG. 1L

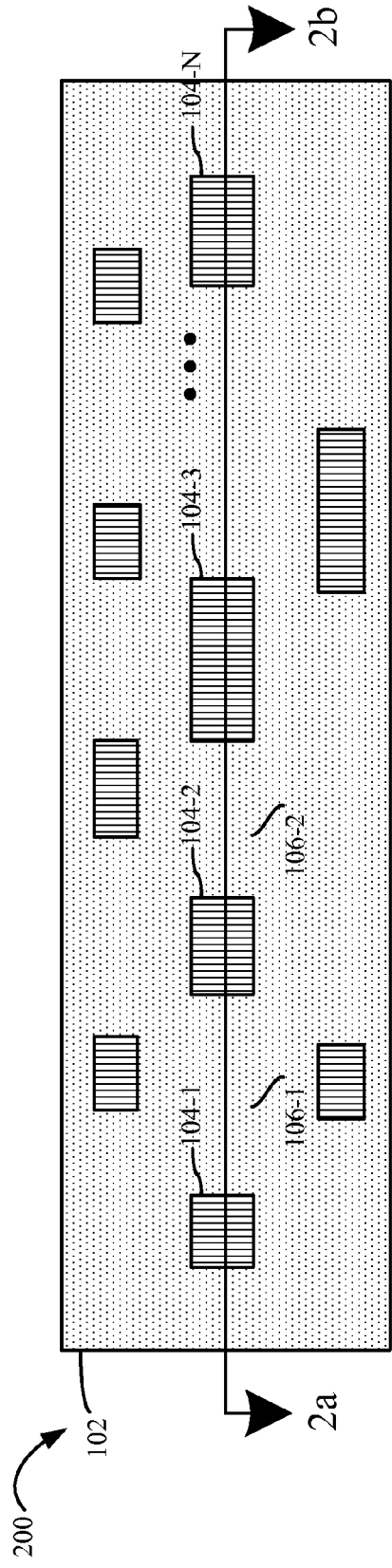
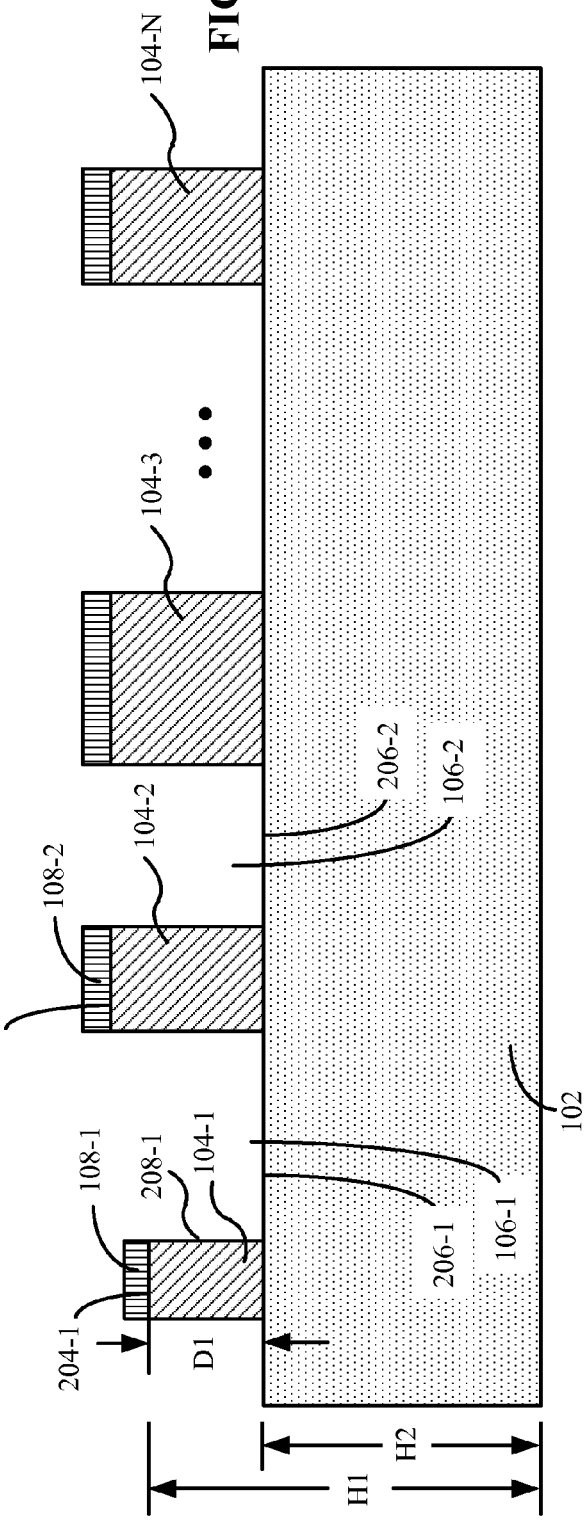
FIG. 2A
FIG. 2B

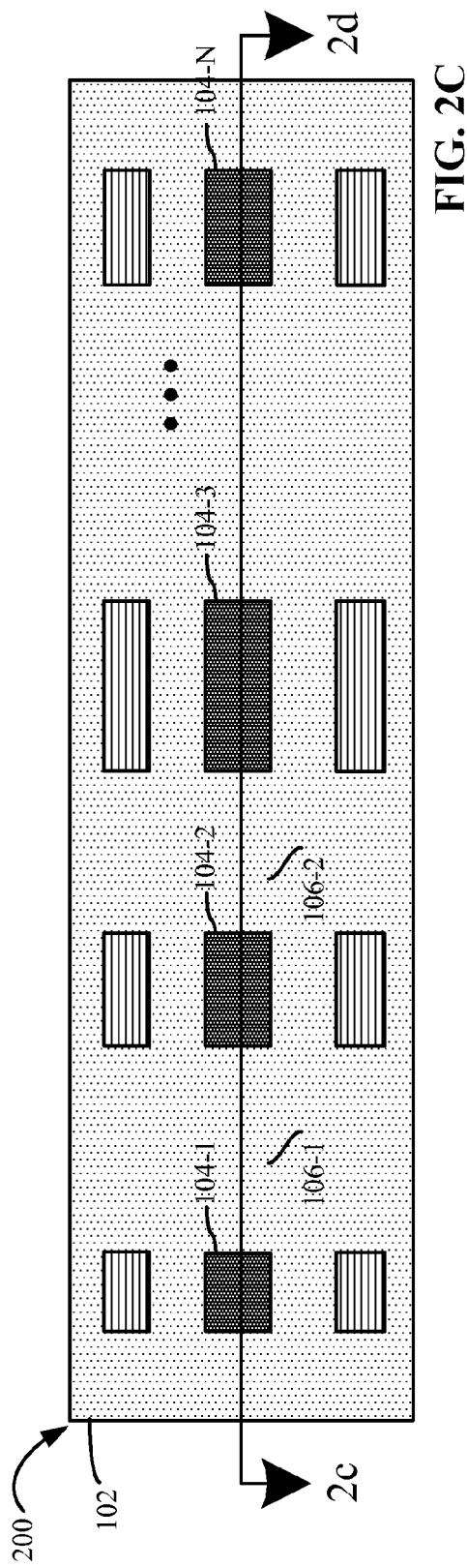
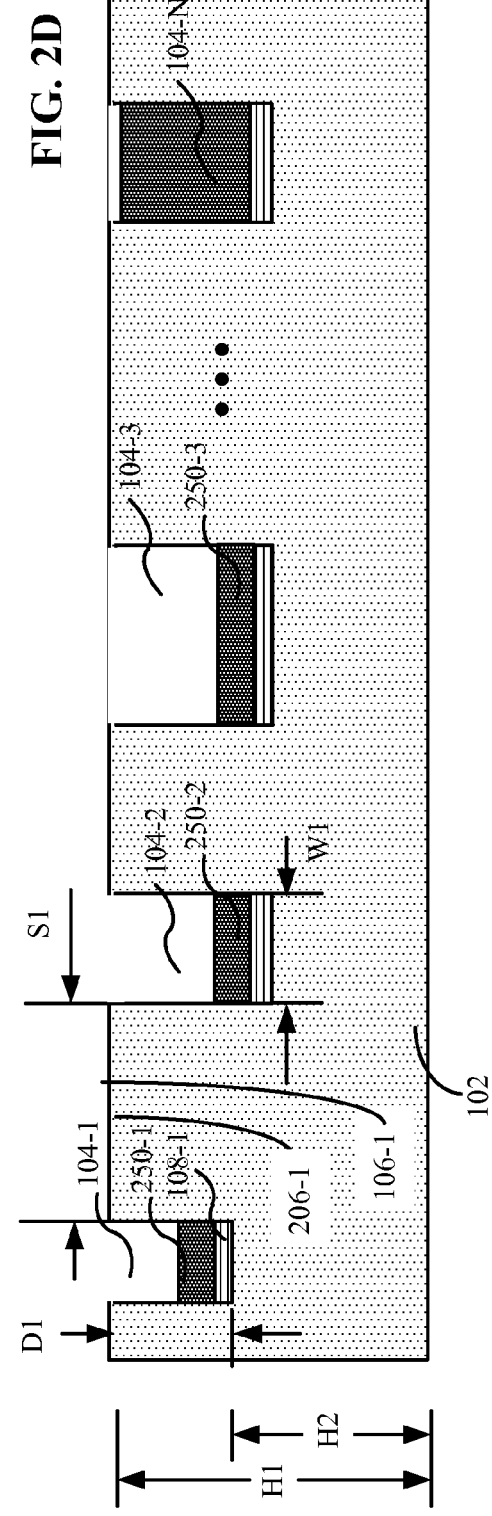

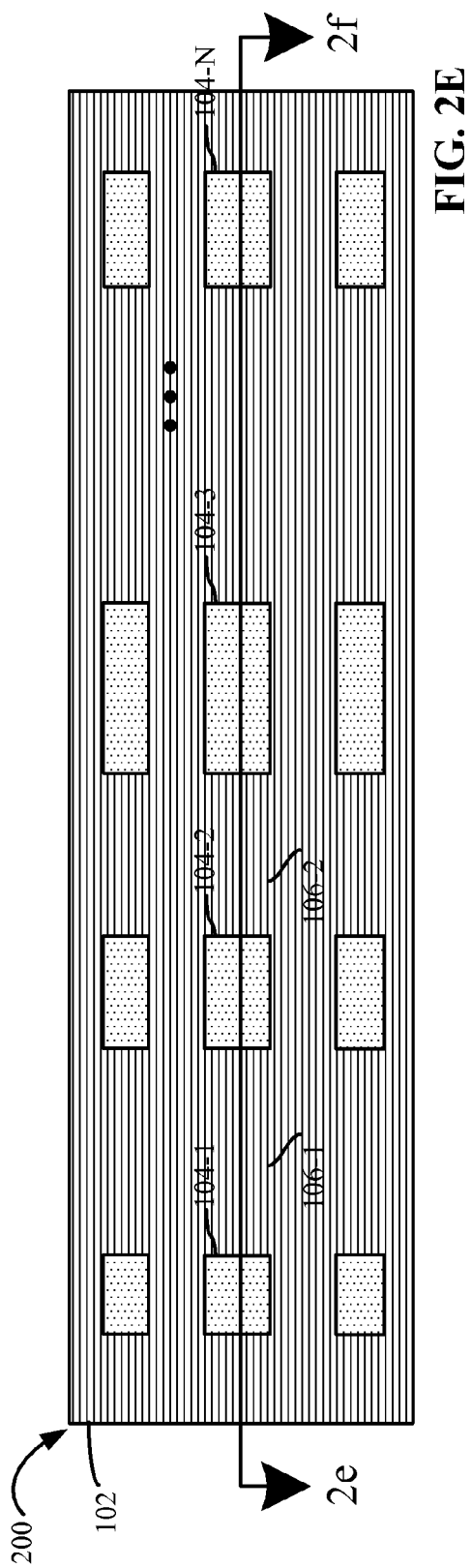
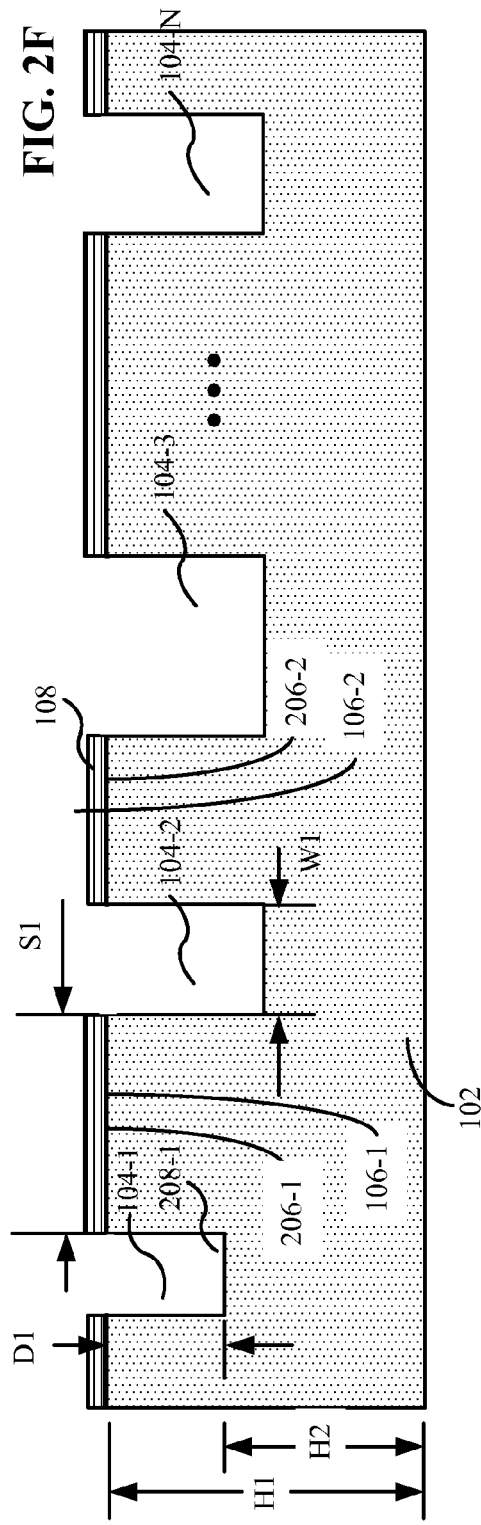

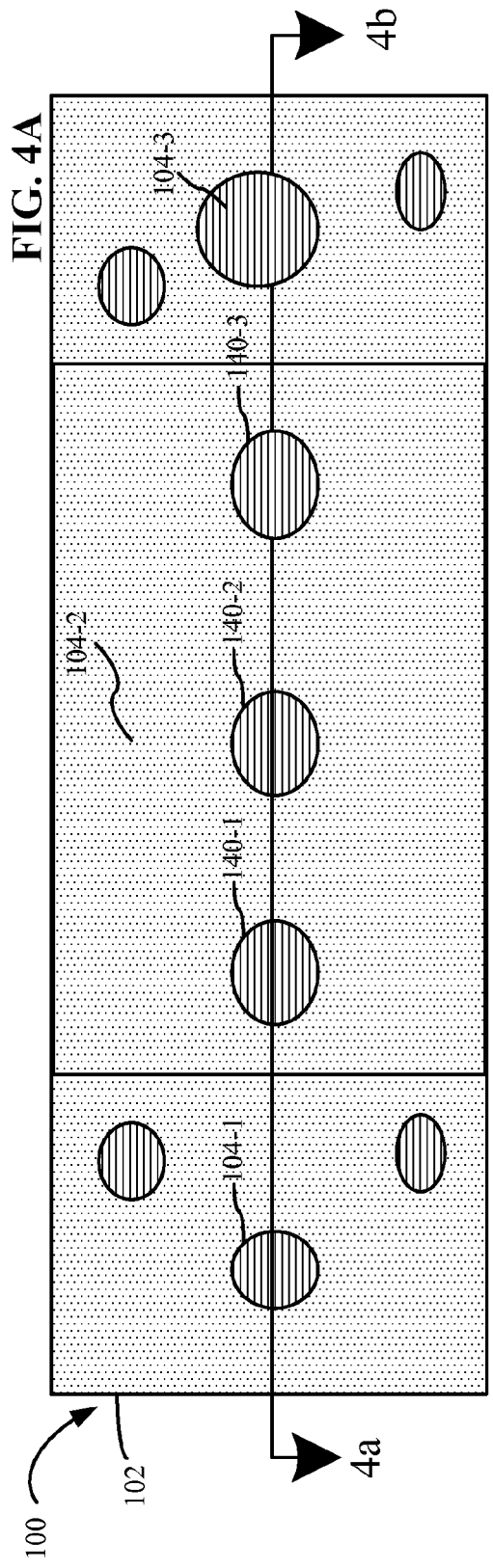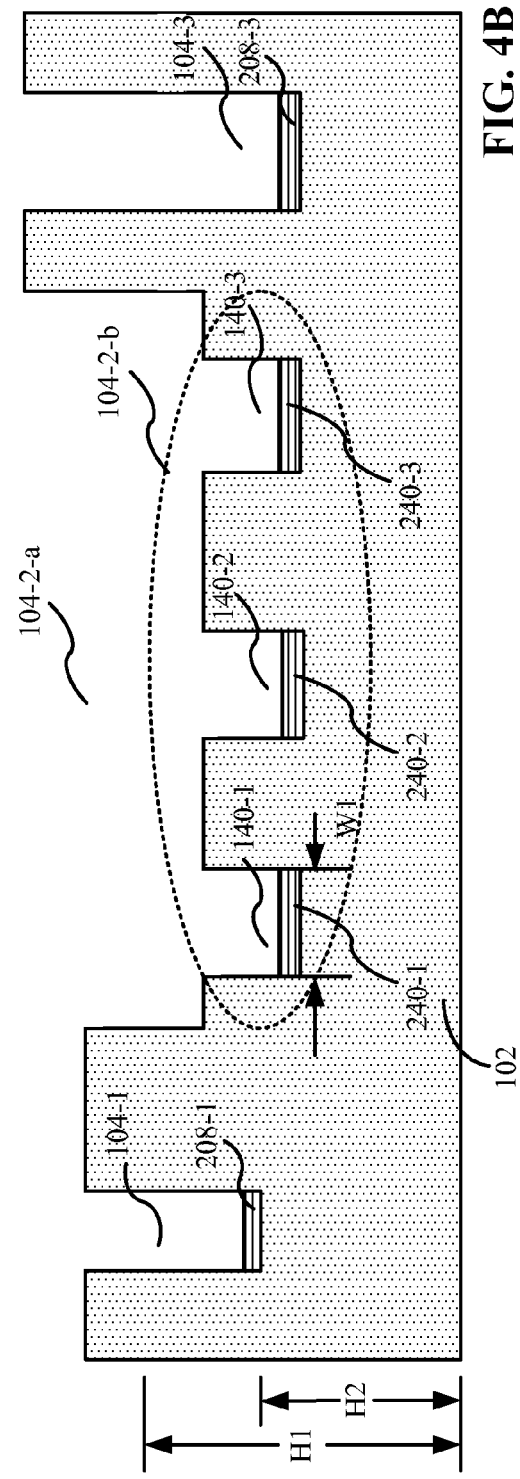

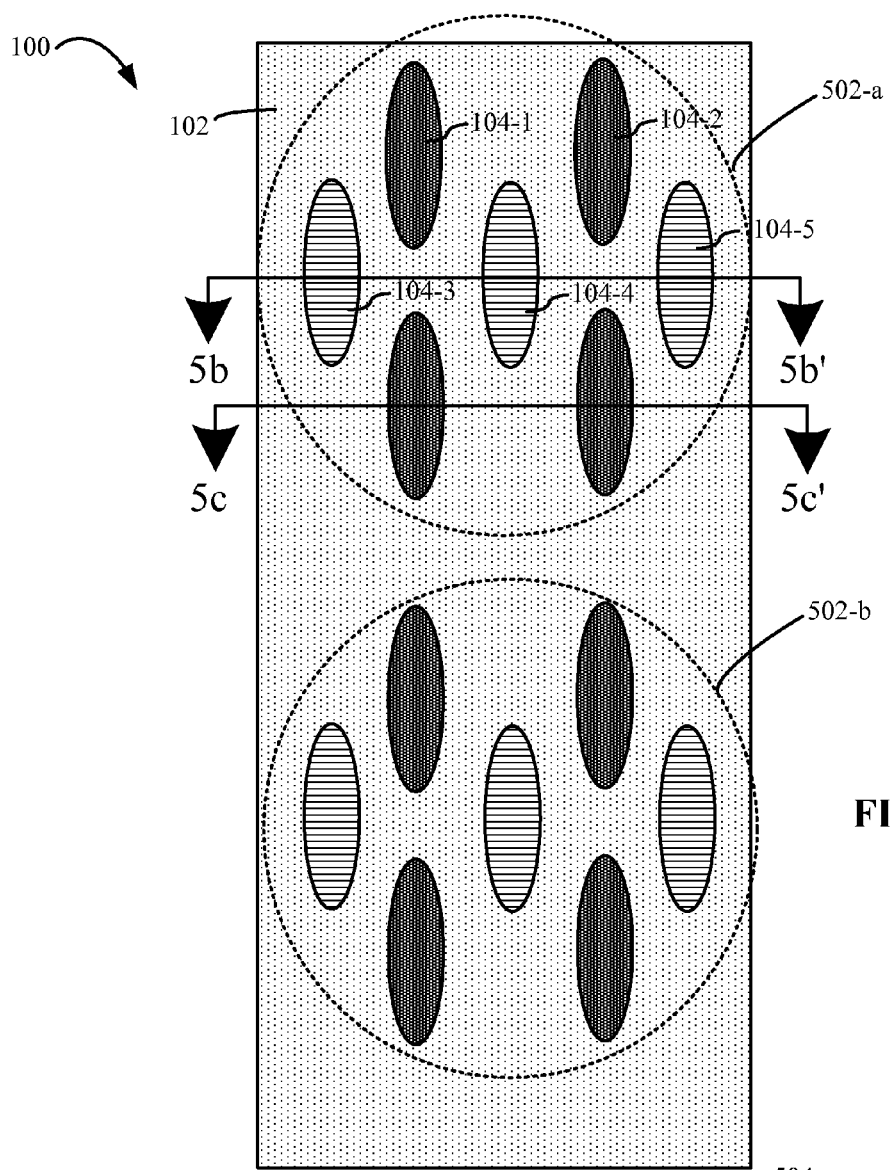
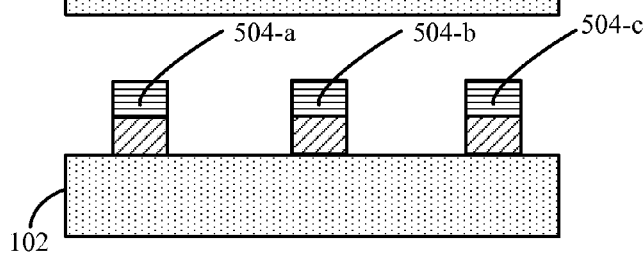
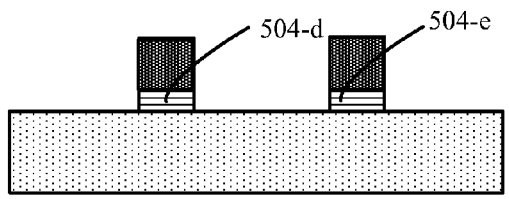
FIG. 5A
FIG. 5B
FIG. 5C

900

Pattern a substrate to form an N-dimensional array of elements on a lateral surface of a substrate:
(i) the N-dimensional array includes a plurality of rows,
(ii) each respective row in the plurality of rows comprises a plurality of elements formed along a first dimension characterized by an axis of the respective row,
(iii) each respective element in the plurality of elements is separated from an adjacent element along the first dimension by a first average spatial separation, thereby resulting in a first periodicity in lateral spacing along the first dimension,
(iv) each respective row in the plurality of rows is separated from an adjacent row along a second dimension by a second average spatial separation, thereby resulting in a second periodicity in lateral spacing along the second dimension
— 902

The N-dimensional array is a linear array (e.g., with uniform spacing between consecutive elements and/or between consecutive rows)
— 904

The N-dimensional array is a non-linear array (e.g., with non-uniform spacing between consecutive elements and/or between consecutive rows)
— 906

The N-dimensional array comprises a substantially radial arrangement of the plurality of rows (e.g., with a predefined angle of separation between consecutive rows of the plurality of rows)
— 908

The plurality of elements is formed by engraving (e.g., etching) a plurality of cavities into the substrate in a direction substantially orthogonal to the native lateral surface of the substrate
— 910

The plurality of elements is formed by growing portions of substrate material or growing at least one respective secondary material selectively at regions of the substrate or the secondary material corresponding to the plurality of elements
— 912

The substrate substantially comprises a material selected from the group consisting of: neoceram, barosilicate glass, germanium arsenide, a IV-V semiconductor material, a substantially metallic material, a high temperature glass, and a combination thereof
— 914

The substrate substantially comprises $SiO_2$ glass, soda lime glass, lead glass, doped $SiO_2$, aluminosilicate glass, borosilicate glass, dichroic glass, germanium/semiconductor glass, glass ceramic, silicate/fused silica, quartz or chalcogenide/sulphide glass
— 916

| Pattern a substrate to form an N-dimensional array of elements on a lateral surface of a substrate: | 902 |

Each respective element in the plurality of elements comprises a respective projection in a direction substantially orthogonal to the lateral surface of the substrate — 918

Each respective element in the plurality of elements is a rib, a mesa, a pillar, or any combination thereof — 919

Each respective element in the plurality of elements comprises a corresponding cavity in a plurality of cavities engraved into the substrate in a direction substantially orthogonal to the native lateral surface of the substrate — 920

Each respective element in the plurality of elements comprises a plurality of contiguous cavities in the substrate in a direction substantially orthogonal to the native lateral surface of the substrate, and wherein the plurality of contiguous cavities is stacked contiguously along the direction substantially orthogonal to the lateral surface of the substrate — 922

Each respective element in the plurality of elements is a quantum dot formed on the native lateral surface of the substrate; and the quantum dot further includes a respective graphene stack formed over the quantum dot to cover at least a portion of a metal-based graphene initiating material on a respective surface of the respective nodule distal from the lateral surface of the substrate — 924

Each respective element in the plurality of elements is a rib comprising a respective foundation material;

a ratio of an average length of the rib to an average width of the rib has a value between 2 and 10 — 926

Each respective element in the plurality of elements is a frustum of a pyramid — 928

```
┌─────────────────────────────────────────────────────────────┐
│ Generate a respective graphene stack on the respective surface of each │
│ element of the plurality of elements using the respective graphene initiating │
│                            layer                              │──942
└─────────────────────────────────────────────────────────────┘

(C)

┌─────────────────────────────────────────────────────────────┐
│ When the respective graphene initiating layer substantially comprises a │──950
│    compound of carbon (see step 936), generating the respective         │
│ graphene stack using the respective graphene initiating layer comprises │
│ heating the respective graphene initiating layer to vaporize an element │
│        other than carbon from the compound of carbon                    │
│  ┌───────────────────────────────────────────────────────┐              │
│  │ When the compound of carbon is silicon carbide (see step 938), │     │
│  │  generating the respective graphene stack using the respective │     │
│  │  graphene initiating layer comprises heating the silicon carbide to │──952
│  │      vaporize elemental silicon in the silicon carbide         │     │
│  └───────────────────────────────────────────────────────┘              │
└─────────────────────────────────────────────────────────────┘

┌─────────────────────────────────────────────────────────────┐
│ When the respective graphene initiating layer comprises silicon (see    │
│  step 940), generating the respective graphene stack using the          │
│         respective graphene initiating layer comprises:                 │──954
│  ┌───────────────────────────────────────────────────────┐              │
│  │ Depositing elemental carbon on or into the respective silicon │──956│
│  │              graphene initiating layer                        │     │
│  │   ┌─────────────────────────────────────────────────┐         │     │
│  │   │ Dope the respective silicon graphene initiating layer by │ │     │
│  │   │ implantation of the elemental carbon into the respective │──958│
│  │   │         silicon graphene initiating layer                │ │     │
│  │   └─────────────────────────────────────────────────┘         │     │
│  └───────────────────────────────────────────────────────┘              │
│                              ▼                                          │
│  ┌───────────────────────────────────────────────────────┐              │
│  │ Converting the respective silicon graphene initiating layer into │  │
│  │ silicon carbide by enabling a chemical reaction of the respective │──960
│  │  silicon graphene initiating layer with the deposited elemental   │  │
│  │                          carbon                                   │  │
│  └───────────────────────────────────────────────────────┘              │
│                              ▼                                          │
│  ┌───────────────────────────────────────────────────────┐              │
│  │ Heating the silicon carbide to vaporize the silicon from the silicon │
│  │  carbide by reverse epitaxy, thereby forming the respective       │──962
│  │                    graphene stack                                 │  │
│  └───────────────────────────────────────────────────────┘              │
└─────────────────────────────────────────────────────────────┘

PLASMONIC GRAPHENE DEVICES

CROSS REFERENCE TO RELATED APPLICATIONS

This application is a Continuation of International Application No. PCT/US2014/027417, having an International Filing Date of Mar. 14, 2014, which claims priority to U.S. Patent Application No. 61/802,006, entitled "Plasmonic Device Enhancements," filed Mar. 15, 2013, each of which is hereby incorporated by reference herein in its entirety.

TECHNICAL FIELD

The disclosed embodiments relate generally to devices and methods of fabricating devices with graphene-based structures and topographies and more specifically to plasmonic and electromagnetic interference properties of graphene-based structures and topographies.

BACKGROUND

Electromagnetic interference properties of plasmonic arrays and spatially periodic structures that demonstrate plasmonic resonance effects are of significant research and commercial interest owing to their ease of use and deployment in optical, mechanical, electromechanical systems and the like.

Furthermore, graphene-based structures (such as graphene quantum dots, graphene nanoribbons, graphene nanonetworks, graphene plasmonics, and graphene super-lattices) exhibit superior chemical, mechanical, electronic, and optical properties that have applications and benefits in various electronic devices, composite materials, and implementations for energy generation and storage.

Accordingly, there is a need in the art for improved devices with plasmonic properties and electromagnetic resonance properties that leverage the improved optical, electrical and mechanical properties of graphene-based structures to enhance plasmonic interactions between electromagnetic radiation and graphene.

SUMMARY

This present disclosure addresses the above-identified need and provides improved devices with plasmonic properties and electromagnetic resonance properties. Such graphene-based plasmonic structures lend themselves to use in improved optical and electronic and mechanical devices, systems and components (such as optical lenses, optical filters, DNA sequencing microcavities, a DNA sequencing nanocavities, condenser lenses, a diffraction devices for optical absorption and the like.

In particular, disclosed are graphene-based topographies and devices and methods of fabricating the devices that enable the use of graphene-based structures for improved optical and electromagnetic properties. An integrated graphene-based structure comprises an N-dimensional array of elements formed on a surface of a substrate. The N-dimensional array of elements includes a plurality of rows. Each respective row in the plurality of rows comprises a corresponding plurality of elements formed along a first dimension, the first dimension characterized by an axis of the respective row, each element in the corresponding plurality of elements (a) comprising at least one graphene stack and (b) separated from an adjacent element along the first dimension by a first average spatial separation thereby resulting in a first periodicity in lateral spacing along the first dimension. Each respective row in the plurality of rows is separated from an adjacent row along a second dimension by a second average spatial separation, thereby resulting in a second periodicity in lateral spacing along the second dimension. The N-dimensional array exhibits a set of characteristic electromagnetic interference properties in response to electromagnetic radiation incident on the N-dimensional array.

In some embodiments, the set of characteristic electromagnetic interference properties is associated with an interaction of the at least one respective graphene stack with the incident electromagnetic radiation. In some embodiments, the set of characteristic electromagnetic interference properties comprises a first plasmonic resonance, occurring at a first resonance wavelength of incident electromagnetic radiation, characterized by the first periodicity in lateral spacing along the first dimension and determined in accordance with the first average spatial separation along the first dimension.

BRIEF DESCRIPTION OF THE DRAWINGS

FIG. 1A illustrates a top view of an exemplary graphene device topography (e.g., an array comprising rows of elements formed as projections from a substrate with one or more graphene stacks on the top surfaces of the elements distal from the native surface of the substrate) fabricated by exemplary methods in accordance with an embodiment of the present disclosure.

FIG. 1B illustrates a cross-sectional view of the exemplary graphene device topography taken along line $1a$-$1b$ of FIG. 1A and fabricated by an exemplary method in accordance with an embodiment of the present disclosure.

FIG. 1C illustrates a top view of an exemplary graphene device topography (e.g., a non-linear array comprising rows of elements spaced non-uniformly and formed as trenches engraved into a substrate with one or more graphene stacks on the trench surfaces of the elements) fabricated by exemplary methods in accordance with an embodiment of the present disclosure.

FIG. 1D illustrates a cross-sectional view of the exemplary graphene device topography taken along line $1c$-$1d$ of FIG. 1C and fabricated by an exemplary method in accordance with an embodiment of the present disclosure.

FIG. 1E illustrates a top view of an exemplary graphene device topography (e.g., an array comprising rows of elements formed as trenches engraved into a substrate with one or more graphene stacks on the native surface of the substrate) fabricated by exemplary methods in accordance with an embodiment of the present disclosure.

FIG. 1F illustrates a cross-sectional view of the exemplary graphene device topography taken along line $1e$-$1f$ of FIG. 1E and fabricated by an exemplary method in accordance with an embodiment of the present disclosure.

FIG. 1G illustrates a top view of an exemplary graphene device topography (e.g., an array comprising a substantially radial arrangement of rows of elements formed as trenches engraved into a substrate with one or more graphene stacks on the native surface of the substrate and one or more graphene stacks in the trench surfaces of the elements) fabricated by exemplary methods in accordance with an embodiment of the present disclosure.

FIG. 1H illustrates a cross-sectional view of the exemplary graphene device topography taken along line $1g$-$1h$ of FIG. 1G and fabricated by an exemplary method in accordance with an embodiment of the present disclosure.

FIG. 1I illustrates a top view of an exemplary graphene device topography (e.g., an array comprising rows of elements formed as projections from a substrate with one or more graphene stacks on the bottom surfaces of the elements proximal to the native surface of the substrate) fabricated by exemplary methods in accordance with an embodiment of the present disclosure.

FIG. 1J illustrates a cross-sectional view of the exemplary graphene device topography taken along line 1*i*-1*j* of FIG. 1I and fabricated by an exemplary method in accordance with an embodiment of the present disclosure.

FIG. 1K illustrates a top view of an exemplary graphene device topography (e.g., a plurality of elements along a row of an array formed as trenches engraved into a substrate with one or more graphene stacks on the side walls of the engraved trenches) fabricated by exemplary methods in accordance with an embodiment of the present disclosure FIG. 1L illustrates a cross-sectional view of the exemplary graphene device topography taken along line 1*k*-1*l* of FIG. 1K and fabricated by an exemplary method in accordance with an embodiment of the present disclosure.

FIG. 2A illustrates a top view of an exemplary graphene device topography (e.g., a non-linear array comprising rows of non-uniformly spaced elements formed as projections from a substrate with one or more graphene stacks on the top surfaces of the elements distal from the native surface of the substrate) fabricated by exemplary methods in accordance with an embodiment of the present disclosure.

FIG. 2B illustrates a cross-sectional view of the exemplary graphene device topography taken along line 2*a*-2*b* of FIG. 2A and fabricated by an exemplary method in accordance with an embodiment of the present disclosure.

FIG. 2C illustrates a top view of an exemplary graphene device topography (e.g., an array comprising rows of elements formed as trenches engraved into a substrate with one or more graphene stacks on the trench surfaces of the trenches and a secondary layer formed over the one or more graphene stacks of one or more of the elements) fabricated by exemplary methods in accordance with an embodiment of the present disclosure.

FIG. 2D illustrates a cross-sectional view of the exemplary graphene device topography taken along line 2*c*-2*d* of FIG. 2C and fabricated by an exemplary method in accordance with an embodiment of the present disclosure.

FIG. 2E illustrates a top view of an exemplary graphene device topography (e.g., an array comprising rows of elements formed as trenches engraved into a substrate with one or more graphene stacks on the native surface of the substrate) fabricated by exemplary methods in accordance with an embodiment of the present disclosure.

FIG. 2F illustrates a cross-sectional view of the exemplary graphene device topography taken along line 2*e*-2*f* of FIG. 2E and fabricated by an exemplary method in accordance with an embodiment of the present disclosure.

FIG. 4A illustrates a top view of an exemplary graphene device topography (e.g., a non-linear array comprising rows of non-uniformly spaced elements engraved as one or more layers of trenches into the substrate with one or more graphene stacks on the trench surfaces of the elements) fabricated by exemplary methods in accordance with an embodiment of the present disclosure.

FIG. 4B illustrates a cross-sectional view of the exemplary graphene device topography taken along line 4*a*-4*b* of FIG. 4A and fabricated by an exemplary method in accordance with an embodiment of the present disclosure.

FIG. 5A illustrates a top view of an exemplary graphene device topography (e.g., a non-linear array comprising hexagonal sub-arrays elements formed as projections on the substrate with one or more graphene stacks on respective top or bottom surfaces of the elements) fabricated by exemplary methods in accordance with an embodiment of the present disclosure.

FIGS. 5B and 5C illustrate cross-sectional views of the exemplary graphene device topography taken along lines 5*b*-5*b*' and 5*c*-5*c*' of FIG. 5A and fabricated by an exemplary method in accordance with an embodiment of the present disclosure.

FIGS. 9A-9E illustrate a flow diagram representing exemplary process flow for the fabrication of one or more graphene device topography in accordance with an embodiment of the present disclosure.

Like reference numerals refer to corresponding parts throughout the drawings.

DESCRIPTION OF EMBODIMENTS

Figure 3:
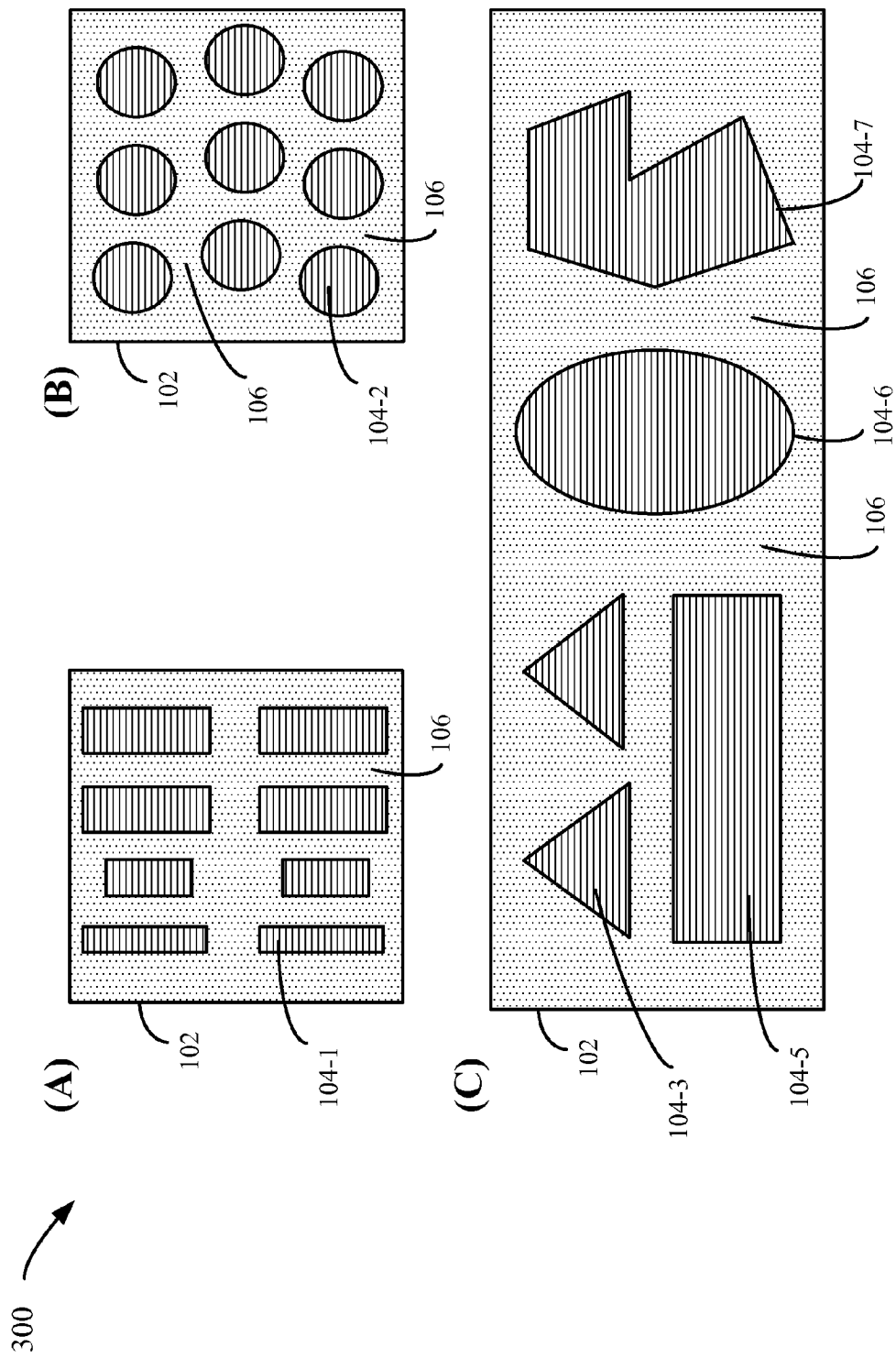
FIGS. 3A-3C illustrate top views of exemplary graphene device topographies fabricated by exemplary methods in accordance with embodiments of the present disclosure.
FIG. 3D illustrates a cross-sectional view of exemplary graphene device topography (e.g., a row of elements with one or more graphene stacks covered with one or more secondary materials formed as projections on a substrate) fabricated by exemplary methods in accordance with an embodiment of the present disclosure.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Reference will now be made in detail to various embodiments, examples of which are illustrated in the accompanying drawings. In the following detailed description, numerous specific details are set forth in order to provide a thorough understanding of the invention and the described embodiments. However, the invention may be practiced without these specific details. In other instances, well-known methods, procedures, components, and circuits have not been described in detail so as not to unnecessarily obscure aspects of the embodiments.

In some embodiments, graphite-based structures, e.g. graphene quantum dots, graphene nanoribbons (GNRs), graphene nanonetworks, graphene plasmonics and graphene super-lattices, exhibit many exceptional chemical, mechanical, electronic and optical properties, and are very desirable for use in electronic devices, composite materials, and energy generation and storage. Such graphite-based structures in general comprise a graphene layer, typically nanometers thick and having a characteristic dimension also in the nanometers range. For example, in order to obtain adequate band gaps for operation at room temperature, GNRs are required to have a width within a few nanometers due to the inverse relationship between the band gap and the width of the GNRs.

In some embodiments, various methods are provided for fabricating graphite-based structures while achieving desired size, specified geometries, and characterized electronic properties of the graphite-based structures. These methods include, but are not limited to, (1) the combination of e-beam lithography and oxygen plasma etching; (2) stripping of graphite that is sonochemically processed; and (3) bottom-up chemical synthesis, e.g., by cyclodehydrogenation of 1,4-diiodo-2,3,5,6-tetraphenylbenzene 6, or 10,10'-dibromo-9,9'-bianthryl, polyanthrylene oligomers self-assembled on Au(111), Ag(111) or silica substrates, to name a few examples.

In some embodiments, different pitch and duty cycle combinations in graphene devices are utilized to improve efficiency. In particular, in some embodiments, graphene sheets are stacked, with different pitch and critical dimensions, such that devices have multiple pass functionality. Similarly, in some embodiments, structures comprising multiple levels of graphene layers allow for more versatile and efficient band gap devices.

Embodiments of the present disclosure are described in the context of methods for fabricating thin films from layered materials and in the context of thin films made therefrom. In this specification and claims, layered materials refer to a material comprising a plurality of sheets, with each sheet having a substantially planar structure.

As used herein, the term "thin films" refers to a thin layer comprising one sheet (e.g., a sheet of graphene); it also refers to several, several tens, hundreds or thousands of such sheets. The thickness of the thin films can range from a nanometer to several micrometers, or to several tens of micrometers. Final thin films produced by some processes disclosed in this application have a thickness in nanometers, and preferably less than fifty nanometers. Similarly, as used herein, a "graphene layer" refers to several, several tens, several hundreds or several thousands of such sheets. As user herein a sheet is a sheet of graphene, which is a single sheet composed of $sp^2$-hybridized carbon.

As used herein, the term "stacks" refers to one or more layers of a material (e.g., one or more layers of graphene). Like "thin films," "stacks" can also refer to several, several tens, several hundreds or several thousands of layers of material. For example, a stack of graphene refers to one or more layers of graphene or graphene structures. As used herein, the term "graphene structures" is used interchangeably with "graphene." As used herein, the term "stacks" is interchangeable with the terms "graphene stacks" and "stacks of graphene."

As used herein, the terms "graphene based nanostructure" and "graphene nanostructure" are interchangeable and refer to any carbon based structure incorporating graphene. Examples of graphene based nanostructures include, but are not limited to, graphene nanoribbons, graphene nanonetworks, graphene poles/pillars, and graphene based nanohole superlattices.

As used herein, the term "level" refers to one or more graphene stacks for a given foundation layer or substrate. Thus, in some embodiments, a level of graphene contains multiple graphene stacks formed from a respective foundation layer or substrate. As sometimes used herein, "level" is shorthand for "graphene level" or "level of graphene."

As used herein, the term "substrate" refers to one layer or multiple layers. In some embodiments, a substrate is glass, Si, $SiO_2$, SiC, or another material. When referring to multiple layers, the term "substrate" is equivalent to and interchangeable with the term "substrate stack."

As used herein, the term "foundation material" refers to any material that is suitable for growing graphene. In some embodiments, foundation materials are catalytic metals, e.g., Pt, Au, Fe, Rh, Ti, Ir, Ru, Ni, or Cu. In some other embodiments, foundation materials are non-metal materials, such as Si, SiC, non-stoichiometric SiC (e.g., boron doped or otherwise), and other carbon enhanced materials. As used herein, the phrase "carbon enhanced" materials refers to any materials into which carbon has been added.

In some implementations, the substrate used in the present disclosure is glass, silicon, SiC, $SiO_2$, or SiC/Si. In some embodiments, the substrate is a solid substance in a form of a thin slice. In some embodiments, the substrate is planar. In some embodiments the substrate is flexible. In some embodiments the substrate is rigid. In various embodiments, the substrate is made of a dielectric material, a semiconducting material, a metallic material, or a combination of such materials. Exemplary dielectric materials include glass, silicon dioxide, neoceram, and sapphire. Exemplary semiconducting materials include silicon (Si), silicon carbide (SiC), germanium (Ge), boron nitride (BN), and molybdenum sulfide (MoS). Exemplary metallic materials comprise copper (Cu), nickel (Ni), platinum (Pt), gold (Au), cobalt (Co), ruthenium (Ru), palladium (Pd), titanium (Ti), silver (Ag), aluminum (Al), cadmium (Cd), iridium (Ir), combinations thereof, and alloys thereof. In some embodiments the substrate comprises Si, SiO$_2$, SiC, Cu, Ni, or other materials. In some embodiments, the substrate substantially comprises neoceram, borosilicate glass, germanium arsenide, a IV-V semiconductor material, a substantially metallic material, a high temperature glass, or a combination thereof.

In some embodiments, the substrate substantially comprises SiO$_2$ glass, soda lime glass, lead glass, doped SiO$_2$, aluminosilicate glass, borosilicate glass, dichroic glass, germanium/semiconductor glass, glass ceramic, silicate/fused silica, soda lime glass, quartz or chalcogenide/sulphide glass, fluoride glass, a glass-based phenolic, flint glass, or cereated glass.

In some embodiments, the substrate is made of poly methyl methacrylate (PMMA), polyethylene terephthalate (PET), polyvinyl alcohol (PVA), or cellulose acetate (CA). In some embodiments, the substrate is made of a urethane polymer, an acrylic polymer, a fluoropolymer, polybenzamidazole, polymide, polytetrafluoroethylene, polyetheretherketone, polyamide-imide, glass-based phenolic, polystyrene, crosslinked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

In some embodiments, the substrate includes one layer. In alternative embodiments, the substrate includes a plurality of layers. In some embodiments, a substrate comprises a plurality of layers, each with a different material. In some embodiments, a layer of another substance is applied onto the substrate. In some embodiments, the substrate has crystallographic symmetry.

FIG. 1A illustrates a top view of an exemplary graphene device topography (e.g., an array comprising rows of elements formed as projections from a substrate with one or more graphene stacks on the top surfaces of the elements distal from the native surface of the substrate) fabricated by exemplary methods in accordance with an embodiment of the present disclosure.

FIG. 1B illustrates a cross-sectional view of the exemplary graphene device topography taken along line 1a-1b of FIG. 1A and fabricated by an exemplary method in accordance with an embodiment of the present disclosure.

As shown in FIG. 1A, an integrated graphene-based structure comprises an N-dimensional array of elements formed on a surface of a substrate. The N-dimensional array of elements includes a plurality of rows. Each respective row in the plurality of rows comprises a corresponding plurality of elements formed along a first dimension, the first dimension characterized by an axis of the respective row, each element in the corresponding plurality of elements (a) comprising at least one graphene stack and (b) separated from an adjacent element along the first dimension by a first average spatial separation thereby resulting in a first periodicity in lateral spacing along the first dimension. Each respective row in the plurality of rows is separated from an adjacent row along a second dimension by a second average spatial separation, thereby resulting in a second periodicity in lateral spacing along the second dimension. The N-dimensional array exhibits a set of characteristic electromagnetic interference properties in response to electromagnetic radiation incident on the N-dimensional array.

In some embodiments, the set of characteristic electromagnetic interference properties is associated with an interaction of the at least one respective graphene stack with the incident electromagnetic radiation. In some embodiments, the set of characteristic electromagnetic interference properties comprises a first plasmonic resonance, occurring at a first resonance wavelength of incident electromagnetic radiation, characterized by the first periodicity in lateral spacing along the first dimension and determined in accordance with the first average spatial separation along the first dimension.

In some embodiments, the set of characteristic electromagnetic interference properties comprises a second plasmonic resonance, occurring at a second resonance wavelength of incident electromagnetic radiation, characterized by the second periodicity in lateral spacing along the second dimension and determined in accordance with the second average spatial separation along the second dimension.

In some embodiments, the set of characteristic electromagnetic interference properties is associated with an interaction of a portion of each of one or more of the elements in the N-dimensional array with the incident electromagnetic radiation. In some embodiments, the respective portion of an element in the one or more of the elements in the N-dimensional array comprises a corresponding graphene stack; and the set of characteristic electromagnetic interference properties is associated with an interaction of the corresponding graphene stack with the incident electromagnetic radiation.

In some embodiments, the first average spatial separation is substantially equal to the second average spatial separation. In some embodiments, as shown in FIGS. 1A-1B a first row in the plurality of rows comprises a first element and a second element. The first element has a first height and a first width. The second element has a second height and a second width and a reference position of the first element is spaced at a first distance from a reference position of the second element. In some embodiments, the first height is different than the second height.

In some embodiments, a difference between the first height and the second height is between 5 nanometers and 1000 nanometers. In some embodiments, the first width is different than the second width. In some embodiments, the first distance has a value between 50 nanometers and 200 nanometers. In some embodiments, a graphene stack in the at least one graphene stack comprises between 1 sheet and 500 sheets of graphene. In some embodiments, a graphene stack in the at least one graphene stack has a thickness between 0.3 nanometers and 150 nanometers. In some embodiments, a graphene stack in the at least one graphene stack has a width between 3 nanometers and 100 nanometers.

In some embodiments, the first average spatial separation has a value between 2 nanometers and 150 nanometers. In some embodiments, the second average spatial separation has a value between 2 nanometers and 150 nanometers. In some embodiments, N is a positive integer of value two or greater. In some embodiments, the second dimension is substantially orthogonal to the first dimension.

As shown in FIG. 1B, in some embodiments, the projection includes a first end proximal to the native surface of the substrate and a second end distal to the surface of the substrate and a graphene stack in the at least one graphene stack is formed on the second end of the respective projection.

In some embodiments, a secondary layer is formed on the first end of the projection and the secondary layer comprises a secondary material. In some embodiments, the secondary layer is a passivation layer and the secondary material is a transmissive material. In some embodiments, the secondary layer is a waveguide tuned to a predetermined wavelength. In some embodiments, the secondary material comprises silicon nitride, silicon dioxide, titanium dioxide, tantalum oxide, hafnium oxide, or any combination thereof.

In some embodiments, the secondary layer is an electrically isolating layer and the secondary material comprises a dielectric. In some embodiments, the secondary material comprises a transparent conductive oxide. In some embodiments, the secondary material comprises an electrically conductive material and the secondary layer is an interconnect lead to electrically connect a first conductive material with a second conductive material. In some embodiments, the secondary material comprises an electrically conductive material and the secondary layer redirects energy collected by the graphene stack. In some embodiments, the secondary material comprises a metal. In some embodiments, the secondary material comprises aluminum, platinum, copper, nickel, palladium, tungsten, or any combination thereof. In some embodiments, the secondary layer is a semiconductor device and the secondary material comprises one or more semiconductors, one or more doped semiconductors, or a combination thereof. In some embodiments, the semiconductor device comprises a diode, a resistor, a schottky junction, or any combination thereof. In some embodiments, the secondary material comprises a dielectric material and the secondary layer is a component of a capacitor or a charge collection device or a combination thereof. In some embodiments, the secondary layer is a component of a capacitor or a charge collection device or a combination thereof. In some embodiments, the N-dimensional array of elements forms a component of a sensor, a detector, an antenna, an amplification device, a response analyzer for one or more plasmonic reactions, or any combination thereof. In some embodiments, the secondary layer forms a component of the sensor, the detector, the antenna, the amplification device, or the response analyzer for one or more plasmonic reactions.

In some embodiments, the plurality of elements includes a first element comprising a first graphene stack and a second element comprising a second graphene stack, the first element is characterized by a first width and the second element is characterized by a second width, where the first width is different from the second width, and a reference position of the first element is separated from a reference position of the second element by a first spatial separation.

In some embodiments, the set of characteristic electromagnetic interference properties comprises: a first elemental resonance, occurring at a first elemental wavelength of incident electromagnetic radiation, determined in accordance with the first lateral width of the first element and associated with an interaction of the first graphene stack with the incident electromagnetic radiation; a second elemental resonance, occurring at a second elemental wavelength of incident electromagnetic radiation, determined in accordance with the second lateral width of the second element and associated with an interaction of the second graphene stack with the incident electromagnetic radiation; and, optionally, a respective inter-elemental resonance, occurring at a third elemental wavelength of incident electromagnetic radiation, determined in accordance with the first spatial separation.

FIG. 1C illustrates a top view of an exemplary graphene device topography (e.g., a non-linear array comprising rows of elements spaced non-uniformly and formed as trenches engraved into a substrate with one or more graphene stacks on the trench surfaces of the elements) fabricated by exemplary methods in accordance with an embodiment of the present disclosure.

FIG. 1D illustrates a cross-sectional view of the exemplary graphene device topography taken along line 1c-1d of FIG. 1C and fabricated by an exemplary method in accordance with an embodiment of the present disclosure.

In some embodiments, each respective element in the corresponding plurality of elements comprises a corresponding cavity in a plurality of cavities engraved into the substrate in a direction substantially orthogonal to the native surface of the substrate.

In some embodiments, the corresponding cavity is bounded by a first end proximal to the native surface of the substrate and a second end distal to the native surface of the substrate and a first graphene stack in the at least one graphene stack is formed at the second end of the respective cavity.

In some embodiments, the plurality of rows comprises a first row and a second row and the corresponding plurality of elements in the first row is offset relative to the corresponding plurality of elements in the second row by an average alignment distance.

In some embodiments, the respective plurality of elements of a respective row in the plurality of rows includes a first element, a second element adjacent to the first element, and a third element adjacent to the second element in the respective row; a reference position of the first element is at a first distance from a reference position of the second element; the reference position of the second element is a second distance from a reference position of the third element; and the first distance is different than the second distance, thereby resulting in a non-linear array of elements.

In some embodiments, the plurality of rows includes a first row, a second row adjacent to the first row, and a third row adjacent to the second row; a reference axis of the first row is spaced at a first distance from a reference axis of the second row; the reference axis of the second row is spaced at a second distance from a reference axis of the third row; and the first distance is different than the second distance, thereby resulting in a non-linear array of elements. In some embodiments, the first and second distance is respectively a first and second predefined linear separation of values between 2 nanometers and 150 nanometers.

In some embodiments, the corresponding plurality of elements includes a first element comprising a first cavity characterized by a first width, a second element adjacent to the first element comprising a second cavity characterized by a second width, and a third element adjacent to the second element comprising a third cavity characterized by a third width; a reference position of the first element is a first distance from a reference position of the second element; and the reference position of the second element is a second distance from a reference position of the third element.

In some embodiments, the first distance is different than the second distance. In some embodiments, the first distance is equal to the second distance. In some embodiments, the first width is equal to the second width and the second width is substantially equal to the third width. In some embodiments, the first width is less than the second width and the second width is less than the third width; and the difference between the second width and the first width is equal to a difference between the third width and the second width. In some embodiments, the first width is between 1 nanometer and 300 nanometers, the second width is between 1 nanometer and 300 nanometers, and the third width is between 1 nanometer and 300 nanometers.

In some embodiments, the plurality of elements includes a first element comprising a first graphene stack and a second element comprising a second graphene stack; the first element is characterized by a first width and the second element is characterized by a second width, where the first width is different from the second width; and a reference position of the first element is separated from a reference position of the second element by a first spatial separation.

In some embodiments, the set of characteristic electromagnetic interference properties comprises: a first elemental resonance, occurring at a first elemental wavelength of incident electromagnetic radiation, determined in accordance with the first lateral width of the first element and associated with an interaction of the first graphene stack with the incident electromagnetic radiation; a second elemental resonance, occurring at a second elemental wavelength of incident electromagnetic radiation, determined in accordance with the second lateral width of the second element and associated with an interaction of the second graphene stack with the incident electromagnetic radiation; and, optionally, a respective inter-elemental resonance, occurring at a third elemental wavelength of incident electromagnetic radiation, determined in accordance with the first spatial separation.

In some embodiments, the first element comprises a first cavity in the substrate in a direction substantially orthogonal to the surface of the substrate and the second element comprises a second cavity in the substrate in the direction substantially orthogonal to the surface of the substrate. In some embodiments, the first cavity includes a first end proximal to the native surface of the substrate and a second end distal to the native surface of the substrate; and the first graphene stack is formed on the second end of the first cavity.

FIG. 1E illustrates a top view of an exemplary graphene device topography (e.g., an array comprising rows of elements formed as trenches engraved into a substrate with one or more graphene stacks on the native surface of the substrate) fabricated by exemplary methods in accordance with an embodiment of the present disclosure.

FIG. 1F illustrates a cross-sectional view of the exemplary graphene device topography taken along line 1e-1f of FIG. 1E and fabricated by an exemplary method in accordance with an embodiment of the present disclosure.

As shown in FIGS. 1E-1F, in some embodiments, each respective element in the corresponding plurality of elements comprises a corresponding cavity in a plurality of cavities engraved into the substrate in a direction substantially orthogonal to the native surface of the substrate. In some embodiments, a second graphene stack is formed on the native surface of the substrate.

FIG. 1G illustrates a top view of an exemplary graphene device topography (e.g., an array comprising a substantially radial arrangement of rows of elements formed as trenches engraved into a substrate with one or more graphene stacks on the native surface of the substrate and one or more graphene stacks in the trench surfaces of the elements) fabricated by exemplary methods in accordance with an embodiment of the present disclosure. FIG. 1H illustrates a cross-sectional view of the exemplary graphene device topography taken along line 1g-1h of FIG. 1G and fabricated by an exemplary method in accordance with an embodiment of the present disclosure. As shown in FIGS. 1G-1H, in some embodiments, each respective element in the corresponding plurality of elements comprises a corresponding cavity in a plurality of cavities engraved into the substrate in a direction substantially orthogonal to the native surface of the substrate.

In some embodiments, the corresponding cavity is bounded by first end proximal to the native surface of the substrate and a second end distal to the native surface of the substrate; and a first graphene stack in the at least one graphene stack is formed at the second end of the respective cavity.

In some embodiments, a second graphene stack is formed on the native surface of the substrate. In some embodiments, the first graphene stack has a first set of properties and the second graphene stack has a second set of properties, and the first set of properties is distinct from the second set of properties.

In some embodiments, the first graphene stack comprises M graphene layers and the second graphene stack comprises P graphene layers, where M and P are different positive integers greater than 1. In some embodiments, the plurality of rows includes a first row, a second row adjacent to the first row, and a third row adjacent to the second row; a reference axis of the first row is spaced at a first distance from a reference axis of the second row; the reference axis of the second row is spaced at a second distance from a reference axis of the third row; and the first distance is different than the second distance, thereby resulting in a non-linear array of elements.

In some embodiments, the first and second distance correspond to a first and second predefined angular separation of values between 5° and 85°.

In some embodiments, the second dimension is non-orthogonal relative to the first dimension. In some embodiments, the second dimension is at a fixed predefined angle relative to the first dimension, thereby resulting in a substantially radial arrangement of the plurality of rows. In some embodiments, the plurality of rows is configured along a substantially radial arrangement and the second average spatial separation is an average measure of an angular separation between consecutive rows in the plurality of rows.

FIG. 1I illustrates a top view of an exemplary graphene device topography (e.g., an array comprising rows of elements formed as projections from a substrate with one or more graphene stacks on the bottom surfaces of the elements proximal to the native surface of the substrate) fabricated by exemplary methods in accordance with an embodiment of the present disclosure. FIG. 1J illustrates a cross-sectional view of the exemplary graphene device topography taken along line 1i-1j of FIG. 1I and fabricated by an exemplary method in accordance with an embodiment of the present disclosure. In some embodiments, each respective element in the corresponding plurality of elements comprises a projection in a direction substantially orthogonal to the surface of the substrate. In some embodiments, each respective element in the corresponding plurality of elements is a rib, a mesa, a pillar, or any combination thereof. In some embodiments, the projection includes a first surface proximal to the surface of the substrate and a second surface distal to the surface of the substrate; and a graphene stack in the at least one graphene stacks is formed on the first surface of the respective projection.

In some embodiments, a secondary layer is formed on the lateral surface of the projection; and the secondary layer comprises a secondary material. In some embodiments, the secondary layer is a passivation layer and the secondary material is a transmissive material. In some embodiments, the secondary layer comprises a waveguide guide tuned to a predetermined wavelength. In some embodiments, the secondary material comprises silicon nitride, silicon dioxide, titanium dioxide, tantalum oxide, hafnium oxide, or any combination thereof. In some embodiments, the secondary layer is an electrically isolating layer and the secondary material is a dielectric. In some embodiments, the secondary material comprises a transparent conductive oxide. In some embodiments, the secondary material comprises an electrically conductive material and the secondary layer is an interconnect lead to electrically connect a first conductive material with a second conductive material. In some embodiments, the N-dimensional array of elements forms a component of a DNA sequencing microcavity, a DNA sequencing nanocavity, a microfluidic channel, a condenser lens, a fish eye lens, a diffraction area for optical absorption, or any combination thereof. In some embodiments, the secondary layer forms a component of the DNA sequencing microcavity, the DNA sequencing nanocavity, the microfluidic channel, the condenser lens, the fish eye lens, or the diffraction area for optical absorption.

FIG. 1K illustrates a top view of an exemplary graphene device topography (e.g., a plurality of elements along a row of an array formed as trenches engraved into a substrate with one or more graphene stacks on the side walls of the engraved trenches) fabricated by exemplary methods in accordance with an embodiment of the present disclosure. FIG. 1L illustrates a cross-sectional view of the exemplary graphene device topography taken along line 1k-1l of FIG. 1K and fabricated by an exemplary method in accordance with an embodiment of the present disclosure. In some embodiments, each respective element in the corresponding plurality of elements comprises a corresponding cavity in a plurality of cavities in the substrate; each respective cavity in the plurality of substrates includes (i) a corresponding trench surface formed on a surface of the cavity distal from the native surface of the substrate and (ii) a corresponding side wall formed between the native surface of the substrate and the corresponding trench surface of the cavity. In some embodiments, the corresponding side wall is formed at a predetermined angle to the corresponding trench surface of the cavity. In some embodiments, the predetermined angle has a value between 5° and 85° measured with reference to the corresponding trench surface of the cavity. In some embodiments, a graphene stack the at least one graphene stack is formed on the corresponding side wall of the respective cavity.

FIG. 2A illustrates a top view of an exemplary graphene device topography (e.g., a non-linear array comprising rows of non-uniformly spaced elements formed as projections from a substrate with one or more graphene stacks on the top surfaces of the elements distal from the native surface of the substrate) fabricated by exemplary methods in accordance with an embodiment of the present disclosure. FIG. 2B illustrates a cross-sectional view of the exemplary graphene device topography taken along line 2a-2b of FIG. 2A and fabricated by an exemplary method in accordance with an embodiment of the present disclosure.

FIG. 2C illustrates a top view of an exemplary graphene device topography (e.g., an array comprising rows of elements formed as trenches engraved into a substrate with one or more graphene stacks on the trench surfaces of the trenches and a secondary layer formed over the one or more graphene stacks of one or more of the elements) fabricated by exemplary methods in accordance with an embodiment of the present disclosure. FIG. 2D illustrates a cross-sectional view of the exemplary graphene device topography taken along line 2c-2d of FIG. 2C and fabricated by an exemplary method in accordance with an embodiment of the present disclosure. As shown in FIGS. 2C-2D, in some embodiments, each respective element in the corresponding plurality of elements comprises a corresponding cavity in a plurality of cavities engraved into the substrate in a direction substantially orthogonal to the native surface of the substrate. In some embodiments, the corresponding cavity is bounded by first end proximal to the native surface of the substrate and a second end distal to the native surface of the substrate; and a first graphene stack in the at least one graphene stack is formed at the second end of the respective cavity. In some embodiments, a secondary layer is formed over the first graphene stack; and the secondary layer comprises a secondary material. In some embodiments, the secondary layer is a passivation layer and the respective secondary material is a transmissive material. In some embodiments, the secondary layer comprises a waveguide guide tuned to a respective wavelength. In some embodiments, the secondary material comprises silicon nitride, silicon dioxide, titanium dioxide, tantalum oxide, hafnium oxide, or any combination thereof. In some embodiments, the secondary layer is an electrically isolating layer and the secondary material is a dielectric. In some embodiments, the secondary material comprises a transparent conductive oxide. In some embodiments, the secondary material comprises an electrically conductive material and the secondary layer is an interconnect lead to electrically connect a first conductive material with a second conductive material. In some embodiments, the N-dimensional array of elements forms a component of a DNA sequencing microcavity, a DNA sequencing nanocavity, a microfluidic channel, a condenser lens, a fish eye lens, a diffraction area for optical absorption, or any combination thereof. In some embodiments, the respective secondary layer forms a component of the DNA sequencing microcavity, the DNA sequencing nanocavity, the microfluidic channel, the condenser lens, the fish eye lens, the diffraction area for optical absorption, or any combination thereof.

FIG. 2E illustrates a top view of an exemplary graphene device topography (e.g., an array comprising rows of elements formed as trenches engraved into a substrate with one or more graphene stacks on the native surface of the substrate) fabricated by exemplary methods in accordance with an embodiment of the present disclosure. FIG. 2F illustrates a cross-sectional view of the exemplary graphene device topography taken along line 2e-2f of FIG. 2E and fabricated by an exemplary method in accordance with an embodiment of the present disclosure.

FIGS. 3A-3C illustrate top views of exemplary graphene device topographies fabricated by exemplary methods in accordance with embodiments of the present disclosure. In some embodiments, the first element in the plurality of elements 104 is a rib. In some embodiments, the rib has a length and a width, where the length is at least two times the width. In some embodiments, the rib has a length and a width, where the length is between two times and five times the width. For example, the elements 104 (e.g., element 104-1) shown in FIG. 3A are ribs having a length and a width, where the length is at least two times the width. In various embodiments, a width of a rib is between 1 nm and 10 nm, between 10 nm and 20 nm, between 20 nm and 30 nm, between 30 nm and 40 nm, between 50 nm and 100 nm, or between 100 nm and 500 nm. In some embodiments, each rib in a plurality of ribs has a width that is on the order of nanometers in width and this width does not deviate from the width of any other rib in the plurality of ribs by more than 0.1 nm, by more than 0.2 nm, by more than 0.3 nm, by more than 0.4 nm, by more than 0.5 nm, by more than 0.6 nm, by more than 0.7 nm, by more than 0.8 nm, by more than 0.9 nm, by more than 1 nm, by more than 2 nm, by more than 3 nm, by more than 4 nm, or by more than 5 nm.

In some embodiments, a first element in the plurality of elements 104 is a mesa. In some embodiments, a mesa is an island isolated from other features on the substrate or a plateau on the substrate. In some embodiments, a mesa has at least one dimension (e.g., width or length) that is relatively large and thus can be used as a basis for further processing of more complex structures. In some embodiments, a mesa has a topographical height feature, providing a capability for vertical isolation and/or size for desired functionality. In some embodiments, the at least one dimension of the mesa is between 10 nm and 100 nm, between 100 nm and 1 μm, or between 1 μm and 10 μm. In some embodiments, the largest dimension of the mesa (e.g., width or length) is on the order of nanometers and does not deviate from the largest dimension of any other mesa in a plurality of mesas by more than 0.1 nm, by more than 0.2 nm, by more than 0.3 nm, by more than 0.4 nm, by more than 0.5 nm, by more than 0.6 nm, by more than 0.7 nm, by more than 0.8 nm, by more than 0.9 nm, by more than 1 nm, by more than 2 nm, by more than 3 nm, by more than 4 nm, or by more than 5 nm.

In some embodiments, the first element in the plurality of elements 104 is a pillar. In some embodiments, the top surface of the pillar (e.g., pillar 104-2, FIG. 3B) is substantially circular. In some embodiments, the top surface of the pillar (e.g., pillar 104-6, FIG. 3C) is substantially ovoid. In some embodiments, the top surface of the pillar (e.g., pillar 104-3, FIG. 3C) on is substantially polygonal. In some embodiments, the top surface of the pillar has an arcuate edge. In some embodiments, the elements 104 have holes within them.

Figure 3D:
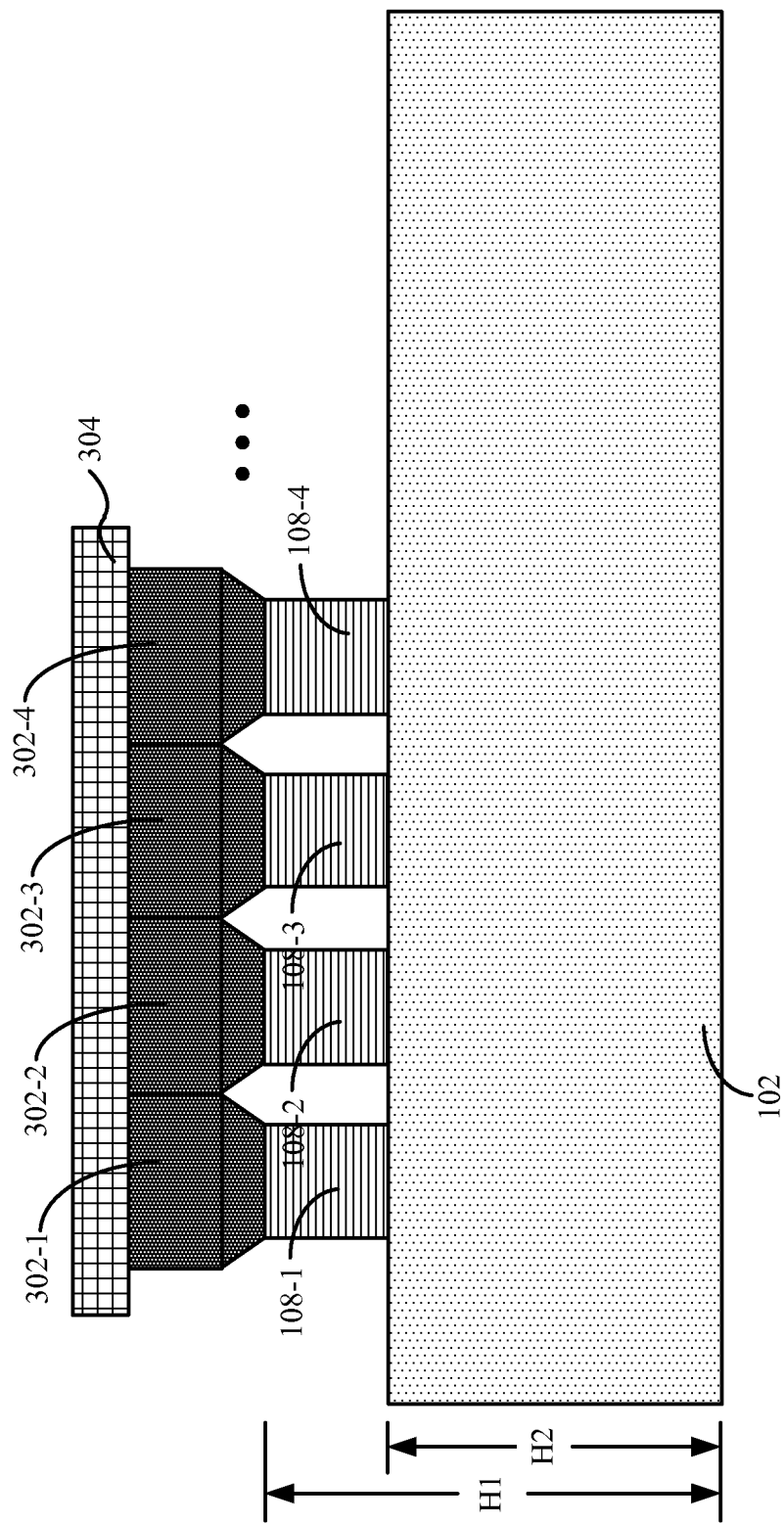

FIG. 3D illustrates a cross-sectional view of exemplary graphene device topography (e.g., a row of elements with one or more graphene stacks covered with one or more secondary materials formed as projections on a substrate) fabricated by exemplary methods in accordance with an embodiment of the present disclosure.

FIG. 4A illustrates a top view of an exemplary graphene device topography (e.g., a non-linear array comprising rows of non-uniformly spaced elements engraved as one or more layers of trenches into the substrate with one or more graphene stacks on the trench surfaces of the elements) fabricated by exemplary methods in accordance with an embodiment of the present disclosure. FIG. 4B illustrates a cross-sectional view of the exemplary graphene device topography taken along line 4a-4b of FIG. 4A and fabricated by an exemplary method in accordance with an embodiment of the present disclosure. In some embodiments, a first element in the corresponding plurality of elements consists of a single continuous cavity comprising a respective side wall and a respective trench surface (e.g., elements 104-1 and 104-3, FIG. 4B). In some embodiments, a graphene stack (e.g., 208-1, 208-3) in the at least one graphene stack is formed on the respective trench surface of the single continuous cavity. In some embodiments, a graphene stack in the at least one graphene stack is formed on the respective side wall of the single continuous cavity.

As shown in FIG. 4B, in some embodiments, a first element in the corresponding plurality of elements includes a first sub-element (e.g., 104-2-a) and a second sub-element (e.g., 104-2-b). The first sub-element comprises an elemental cavity in the substrate in a direction substantially orthogonal to the surface of the substrate. The first sub-element includes a respective elemental trench surface distal to the surface of the substrate and a respective elemental side wall separating the surface of the substrate from the respective elemental trench surface. The second sub-element comprises a plurality of sub-elemental cavities (e.g., 140-1, 140-2, 140-3) formed along a direction parallel to a plane formed by the native surface of the substrate.

In some embodiments, each respective sub-elemental cavity in the plurality of sub-elemental cavities of the second sub-element is stacked contiguous to the first sub-element along the direction substantially orthogonal to the native surface of the substrate and perforates the elemental trench surface of the first sub-element. Each respective sub-elemental cavity in the plurality of sub-elemental cavities of the second sub-element comprises a respective sub-elemental side wall and a respective sub-elemental trench surface. In some embodiments, a graphene stack in the at least one graphene stack is segmentedly formed on the respective sub-elemental trench surface (e.g., 240-1, 240-2, 240-3) of each respective sub-elemental cavity.

In some embodiments, a secondary layer is formed over the graphene stack and the secondary layer comprises a secondary material. The secondary material is optically transparent to a predefined range of wavelengths of electromagnetic radiation incident on the N-dimensional array. In some embodiments, the secondary material substantially fills each respective sub-elemental cavity in the plurality of sub-elemental cavities of the second sub-element. In some embodiments, the secondary layer is a passivation layer and the respective secondary material is a transmissive material. In some embodiments, the secondary layer comprises a waveguide guide tuned to a respective wavelength. In some embodiments, the secondary material comprises silicon nitride, silicon dioxide, titanium dioxide, tantalum oxide, hafnium oxide, or any combination thereof. In some embodiments, the secondary layer is an electrically isolating layer and the respective secondary material is a dielectric. In some embodiments, the secondary material comprises a transparent conductive oxide. In some embodiments, the secondary material comprises an electrically conductive material and the respective layer is an interconnect lead to electrically connect a first conductive material with a second conductive material. In some embodiments, the N-dimensional array of elements forms a component of a DNA sequencing microcavity, a DNA sequencing nanocavity, a condenser lens, a flys eye lens, a diffraction area for optical absorption, or any combination thereof. In some embodiments, the respective secondary layer forms the component of the DNA sequencing microcavity, the DNA sequencing nanocavity, the condenser lens, the flys eye lens, or the diffraction area for optical absorption.

In some embodiments, a graphene stack in the at least one graphene stack is segmentedly formed on the respective sub-elemental side wall of each respective sub-elemental cavity.

FIG. 5A illustrates a top view of an exemplary graphene device topography (e.g., a non-linear array comprising hexagonal sub-arrays elements formed as projections on the substrate with one or more graphene stacks on respective top or bottom surfaces of the elements) fabricated by exemplary methods in accordance with an embodiment of the present disclosure.

FIGS. 5B and 5C illustrate cross-sectional views of the exemplary graphene device topography taken along lines 5b-5b' and 5c-5c' of FIG. 5A and fabricated by an exemplary method in accordance with an embodiment of the present disclosure.

As shown in FIG. 5A, in some embodiments, the N-dimensional array of elements comprises a plurality of spatially-separated sub-arrays of elements including a first element-sub-array (e.g., 502-a) and a second element sub-array (e.g., 502-b); the first element-sub-array comprises M elements (e.g., 7 elements) arranged in M1 rows (e.g., 3 rows), where M is a positive integer of two or greater. The second element sub-array comprises P elements (e.g., 7 elements) arranged in P1 rows (e.g., 3 rows), where P is a positive integer of two or greater. Each respective element in the M elements in the first element-sub-array and each respective element in the P elements in the second element sub-array comprises at least one corresponding graphene stack (e.g., 504-a, 504-b, 504-c, 504-d, and 504-e, as shown in FIGS. 5B, 5C). The set of characteristic electromagnetic interference properties is associated with an interaction of a graphene stack in the M elements and a graphene stack in the P elements with the incident electromagnetic radiation.

As shown in FIG. 5A, in some embodiments, each respective element in the corresponding plurality of elements (e.g., 104-1, 104-2, 104-3, and the like) is a rib comprising a foundation material; a ratio of an average length of the rib to an average width of the rib has a value between 2 and 10 and a graphene stack in the at least one graphene stack is formed over at least a portion of the foundation material (e.g., 504-*a*, 504-*b*, 504-*c*, 504-*d*, and 504-*e*, as shown in FIGS. 5B, 5C).

In some embodiments, the corresponding plurality of elements includes a first element characterized by a first length and a first width and a second element characterized by a second length and a second width a reference position of the first element is spaced a first distance from a reference position of the second element; and a ratio of the first distance to the first length has a value between 1.5 and 5.

In some embodiments, the first element comprises a first foundation material and the second element comprises a second foundation material, distinct from the first foundation material; the first element comprises a first graphene stack covering at least a portion of the first respective foundation material, the first graphene stack characterized by a first set of properties based on properties of the first foundation material; the second element comprises a second graphene stack covering at least a portion of the second foundation material, the second graphene stack characterized by a second set of properties based on properties of the second foundation material; and the first set of properties of the first graphene stack is distinct from the second set of properties of the second graphene stack.

In some embodiments, the set of characteristic electromagnetic interference properties is associated with an interaction of the respective graphene stack formed over at least the portion of the respective foundation material with the incident electromagnetic radiation.

Figure 6:
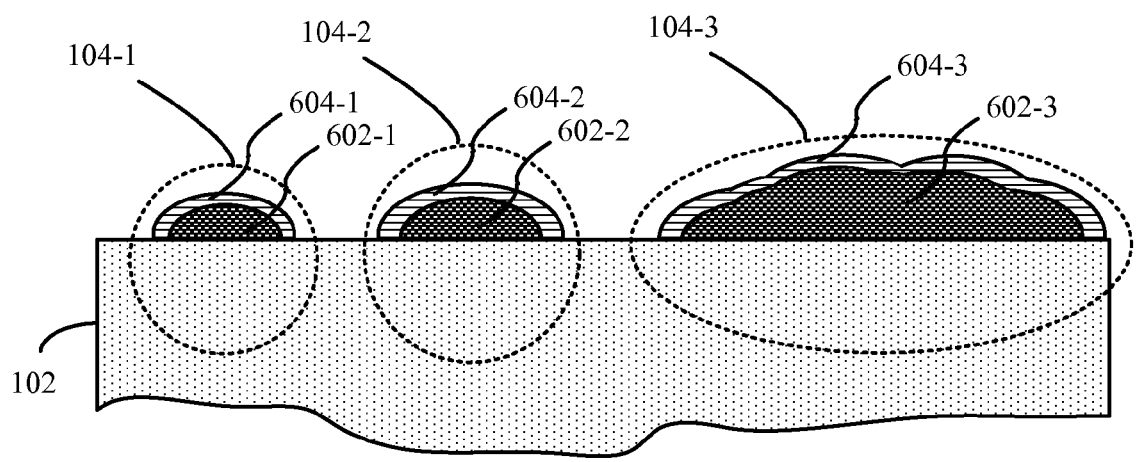
FIG. 6 illustrates a cross-sectional view of exemplary graphene device topography (e.g., quantum dots covered with one or more graphene stacks) fabricated by an exemplary method in accordance with an embodiment of the present disclosure.

FIG. 6 illustrates a cross-sectional view of exemplary graphene device topography (e.g., quantum dots covered with one or more graphene stacks) fabricated by an exemplary method in accordance with an embodiment of the present disclosure.

In some embodiments, each respective element in the corresponding plurality of elements is a corresponding quantum dot (e.g., 104-1, 104-2, 104-3) formed on the native surface of the substrate. The quantum dot comprises (i) a metal-based graphene initiating material (e.g., 602-1, 602-2, 602-3) formed on the native surface of the substrate (e.g., substrate 102) and (ii) the at least one graphene stack (e.g., 604-1, 604-2, 604-3) formed over at least a portion of the metal-based graphene initiating material. In some embodiments, the set of characteristic electromagnetic interference properties is associated with an interaction of the at least one graphene stack formed over the metal-based graphene initiating material with the incident electromagnetic radiation.

FIGS. 7A-7H illustrate cross-sectional views of graphene device topography (e.g., including a plurality of contiguous cavities engraved into the substrate) fabricated by an exemplary method in accordance with an embodiment of the present disclosure.

As shown in FIGS. 7A-7H, in some embodiments, each respective element in the corresponding plurality of elements comprises a plurality of contiguous cavities in the substrate in a direction substantially orthogonal to the native lateral surface of the substrate. In such embodiments, the plurality of contiguous cavities is stacked contiguously along the direction substantially orthogonal to the surface of the substrate. In some embodiments, the plurality of contiguous cavities includes a first cavity (e.g., 704, FIGS. 7A-7C) comprising a first reference axis (e.g., axis 730) orthogonal to the native surface of the substrate (e.g., substrate 102) and a second cavity (e.g., 720, FIGS. 7A-7C) comprising a second native axis orthogonal to the surface of the substrate. The first cavity has a first height defined along the first reference axis. The second cavity has a second height defined along the second reference axis.

In some embodiments, each cavity in the plurality of contiguous cavities includes respective side walls and respective trench surfaces and a graphene stack in the at least one graphene stack is segmentedly formed on each of the respective side walls of each cavity in the plurality of contiguous cavities.

In some embodiments, each cavity in the plurality of contiguous cavities includes respective side walls and respective trench surfaces and a graphene stack in the at least one graphene stack is formed on one or more of the respective trench surfaces of each cavity in the plurality of contiguous cavities.

In some embodiments, the set of characteristic electromagnetic interference properties comprises a first respective intercavity resonance, occurring at a first respective wavelength of incident electromagnetic radiation, determined in accordance with the first height of the first cavity and a second respective wavelength of incident electromagnetic radiation, determined in accordance with the second height of the second cavity.

In some embodiments, each respective cavity in the plurality of contiguous cavities includes a corresponding side wall and a corresponding trench surface. In some embodiments, the corresponding side wall is formed at a predetermined angle to the respective trench surface of each cavity, thereby resulting in a variable lateral width of each cavity between a first width measured proximal to the surface of the substrate and a second width measured proximal to the respective trench surface. In some embodiments, the predetermined angle has a value between 5° and 85° measured relative to the respective trench surface. In some embodiments, a predetermined range of plasmonic resonance wavelengths of incident electromagnetic radiation is defined in accordance with the variable lateral width of each cavity based on the predetermined angle.

In some embodiments, each respective cavity in the plurality of cavities is characterized by an average spatial height along a third dimension measured relative to the native surface of the substrate, thereby resulting in a third periodicity in lateral spacing along the third dimension. In some embodiments, the third dimension is substantially orthogonal to the native lateral surface of the substrate. In some embodiments, the set of characteristic electromagnetic interference properties comprises a third plasmonic resonance effect, occurring at a third resonance wavelength of incident electromagnetic radiation, characterized by the third periodicity in lateral spacing along the third dimension and determined in accordance with the average spatial height along the third dimension.

Figure 7A:
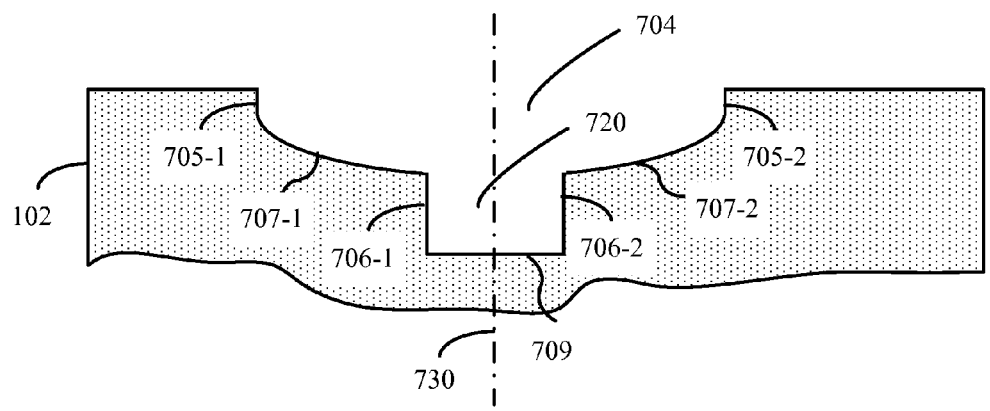
FIGS. 7A-7H illustrate cross-sectional views of graphene device topography (e.g., including a plurality of contiguous cavities engraved into the substrate) fabricated by an exemplary method in accordance with an embodiment of the present disclosure.
Figure 7B:
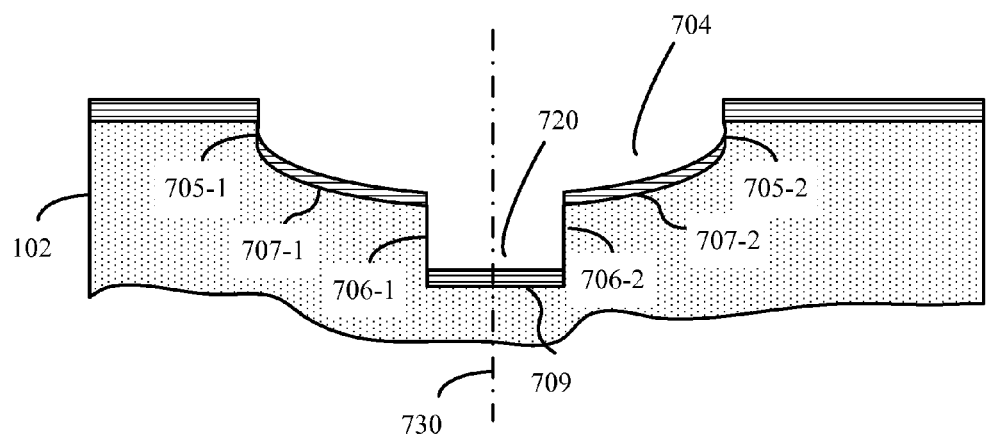

As shown in FIG. 7B, in some embodiments, a graphene stack in the at least one graphene stack is segmentedly formed on each respective trench surface of each cavity in the plurality of contiguous cavities.

Figure 7C:
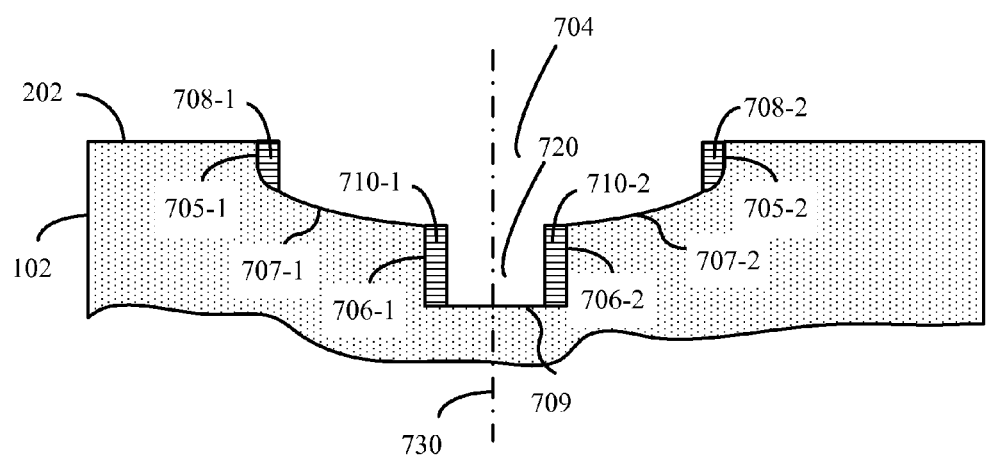

As shown in FIG. 7C, in some embodiments, a graphene stack in the at least one graphene stack is segmentedly formed on each respective side wall of each cavity in the plurality of contiguous cavities.

Figure 7D:
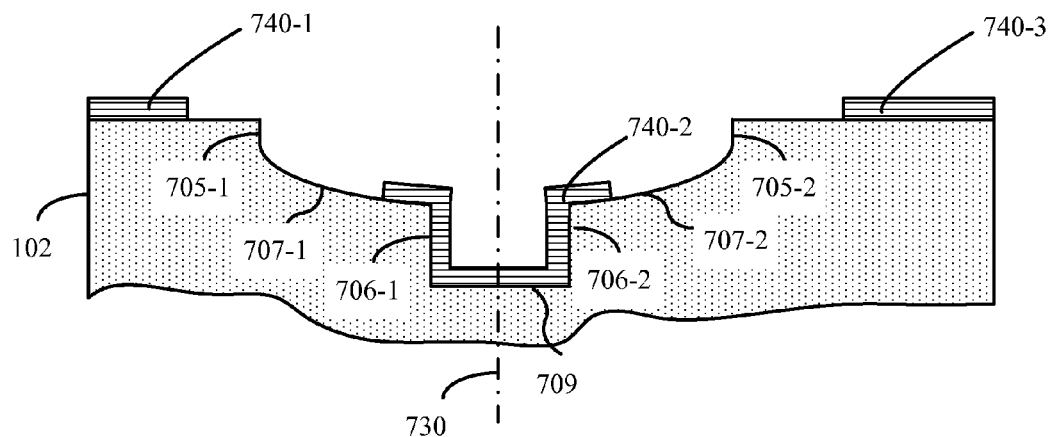

As shown in FIG. 7D, in some embodiments, a graphene stack (e.g., 740-1, 740-2, 740-3) in the at least one graphene stack is segmentedly formed on at least a respective portion of one or more respective surfaces (e.g., at least a portion of a side wall and/or a portion of a respective trench surface; for example, as defined by a mask) one or more cavities in the plurality of contiguous cavities.

Figure 7E:
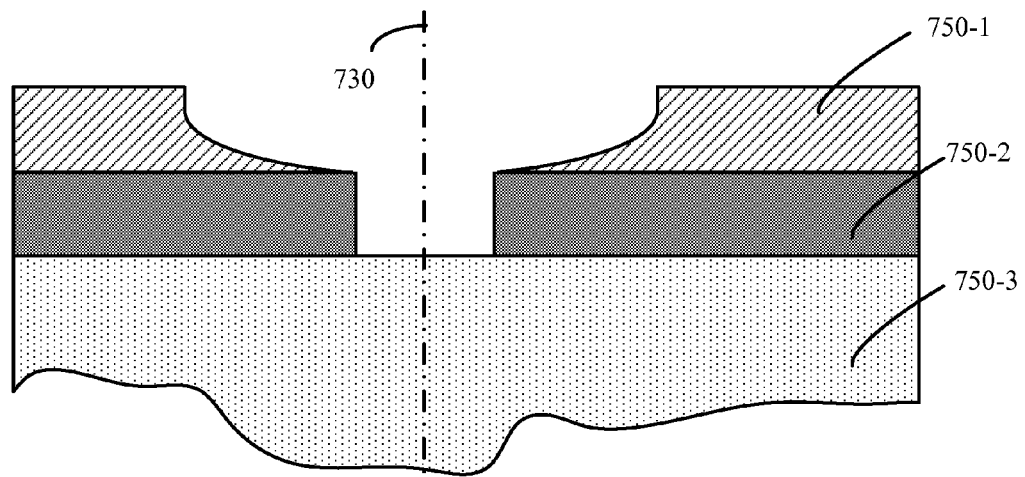

As shown in FIG. 7E, in some embodiments, the substrate comprises a first substrate layer (e.g., 750-1), a second substrate layer (e.g., 750-2), and a third substrate layer (e.g., 750-3), with the first substrate layer defining the native surface of the substrate and overlaying the second substrate layer, the second substrate layer overlaying the third layer. In such embodiments, the first cavity is in the first substrate layer and the second cavity extends to at least a portion of the second substrate layer.

In some embodiments, the first substrate layer substantially comprises a first substrate material, the second substrate layer substantially comprises a second substrate material, and the third substrate layer substantially comprises a third substrate material.

In some embodiments, the first, second and third substrate materials are respectively different from each other. In some embodiments, the first substrate material comprises a dielectric material, a conductive material, a semiconductor material, a doped semiconductor material, a transmissive material, an absorptive material, a transparent conductive oxide, a metal oxide, a metal nitride, a metal, or a combination thereof. In some embodiments, the second substrate material comprises a dielectric material, a conductive material, a semiconductor material, a doped semiconductor material, a transmissive material, an absorptive material, a transparent conductive oxide, a metal oxide, a metal nitride, a metal, or a combination thereof. In some embodiments, the third substrate material comprises a dielectric material, a conductive material, a semiconductor material, a doped semiconductor material, a transmissive material, an absorptive material, a transparent conductive oxide, a metal oxide, a metal nitride, a metal, or a combination thereof.

In some embodiments, the first substrate material comprises silicon, gallium arsenide, germanium, silicon dioxide, titanium dioxide, silicon nitride, hafnium oxide, tantalum oxide, zinc oxide, aluminum oxide, silicon carbide, silicon nitride, titanium nitride, tantalum nitride, neoceram, barosilicate glass, soda lime glass, lead glass, doped silicon dioxide, doped n-type silicon, doped p-type silicon, aluminosilicate glass, dichroic glass, semiconductor glass, glass ceramic, silicate, fused silica, quartz, chalcogenide glass, sulphide glass, poly methyl methacrylate, polyethylene terephthalate, polyvinyl alcohol, cellulose acetate, boron nitride, molybdenum sulfide, zinc, copper, nickel, iron, platinum, gold, palladium, ruthenium, vanadium, hafnium, cadmium, tungsten, aluminum, titanium, cadmium, silver, or a combination thereof.

In some embodiments, the second substrate material comprises silicon, gallium arsenide, germanium, silicon dioxide, titanium dioxide, silicon nitride, hafnium oxide, tantalum oxide, zinc oxide, aluminum oxide, silicon carbide, silicon nitride, titanium nitride, tantalum nitride, neoceram, barosilicate glass, soda lime glass, lead glass, doped silicon dioxide, doped n-type silicon, doped p-type silicon, aluminosilicate glass, dichroic glass, semiconductor glass, glass ceramic, silicate, fused silica, quartz, chalcogenide glass, sulphide glass, poly methyl methacrylate, polyethylene terephthalate, polyvinyl alcohol, cellulose acetate, boron nitride, molybdenum sulfide, zinc, copper, nickel, iron, platinum, gold, palladium, ruthenium, vanadium, hafnium, cadmium, tungsten, aluminum, titanium, cadmium, silver, or a combination thereof.

In some embodiments, the third substrate material comprises silicon, gallium arsenide, germanium, silicon dioxide, titanium dioxide, silicon nitride, hafnium oxide, tantalum oxide, zinc oxide, aluminum oxide, silicon carbide, silicon nitride, titanium nitride, tantalum nitride, neoceram, barosilicate glass, soda lime glass, lead glass, doped silicon dioxide, doped n-type silicon, doped p-type silicon, aluminosilicate glass, dichroic glass, semiconductor glass, glass ceramic, silicate, fused silica, quartz, chalcogenide glass, sulphide glass, poly methyl methacrylate, polyethylene terephthalate, polyvinyl alcohol, cellulose acetate, boron nitride, molybdenum sulfide, zinc, copper, nickel, iron, platinum, gold, palladium, ruthenium, vanadium, hafnium, cadmium, tungsten, aluminum, titanium, cadmium, silver, or a combination thereof.

Figure 7F:
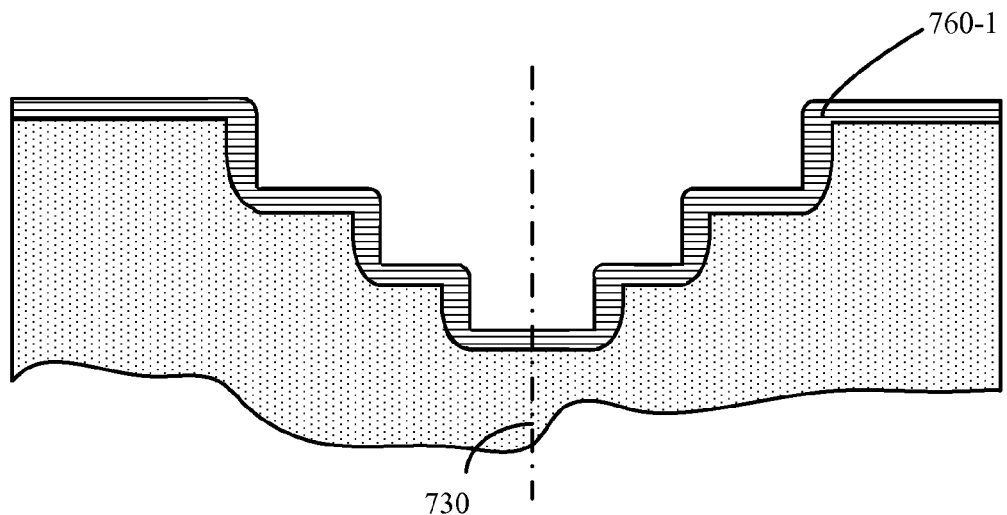
Figure 7G:
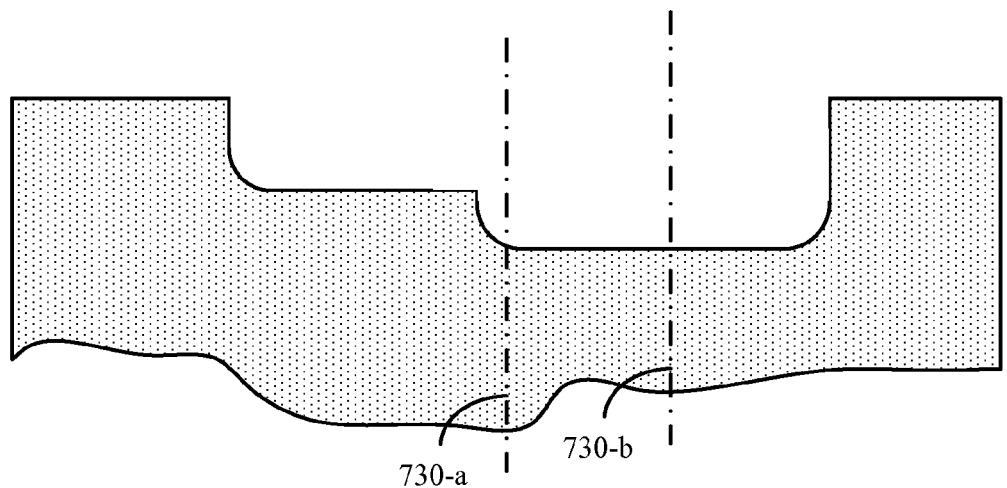
Figure 7H:
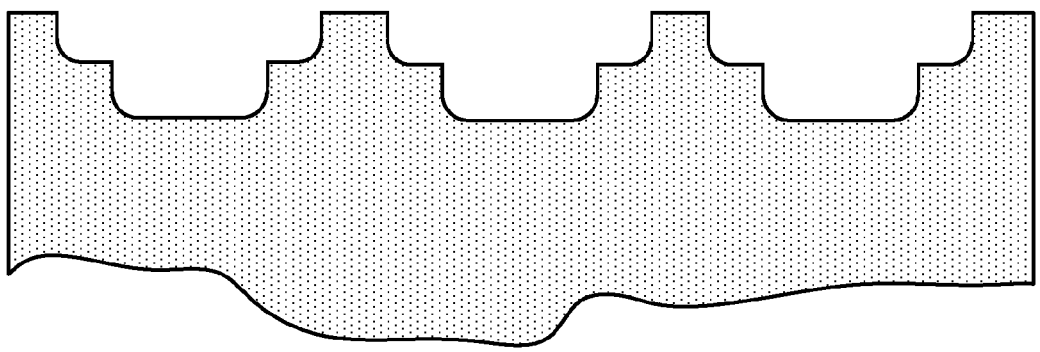

As shown in FIG. 7F, a graphene stack in the at least one graphene stack is a continuous graphene stack (e.g., 760-1) formed on a continuous surface formed by each respective side wall and each respective trench surface of each cavity in the plurality of contiguous cavities.

In some embodiments, each contiguous cavity in the plurality of contiguous cavities has a common central axis (e.g., axis 730, FIGS. 7A-7F) orthogonal to the native surface of the substrate.

In some embodiments, the plurality of contiguous cavities includes a first cavity comprising a first reference axis orthogonal to the native surface of the substrate and a second cavity comprising a second reference axis orthogonal to the native surface of the substrate; and the first reference axis is distinct from and parallel to the second reference axis.

Figure 8A:
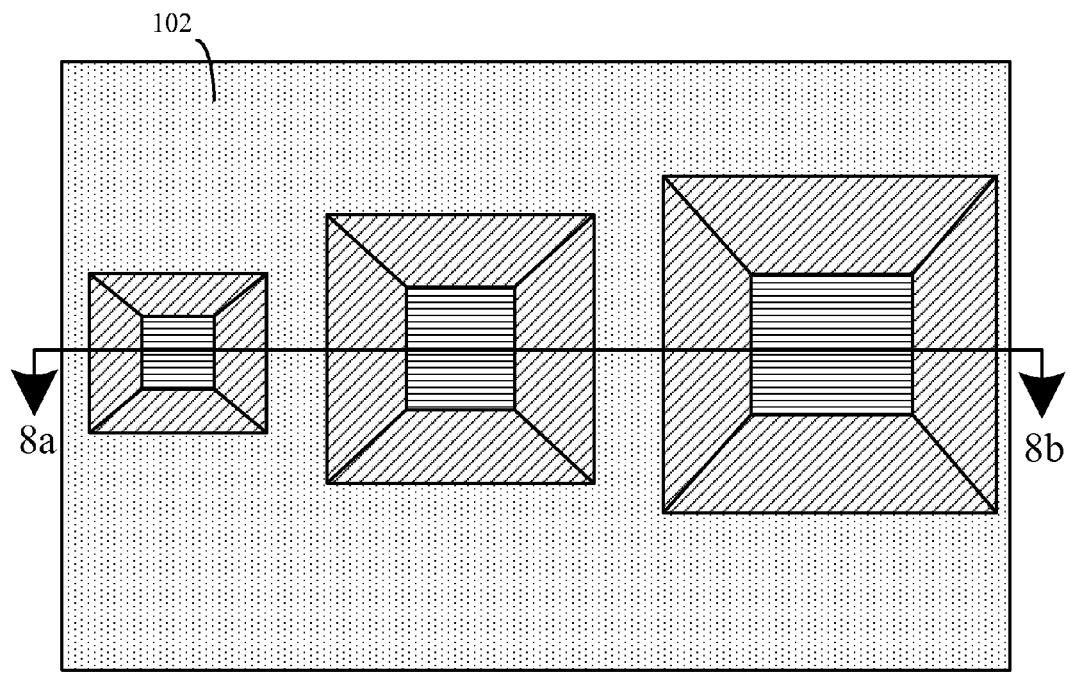
FIGS. 8A, 8C and 8E illustrate top views of an exemplary graphene device topography (e.g., elements along a row of an array formed as projections with shapes corresponding to frustums of pyramids on the substrate with one or more graphene stacks on respective top surfaces, side walls, and a combination thereof) fabricated by exemplary methods in accordance with an embodiment of the present disclosure.
Figure 8B:
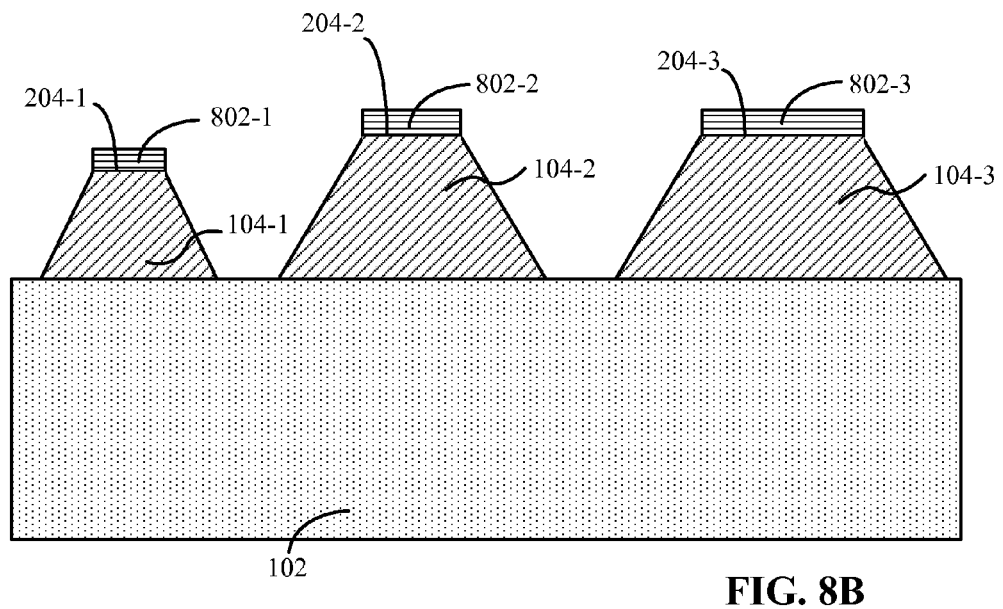
FIGS. 8B, 8D and 8F illustrate cross-sectional views of the exemplary graphene device topography taken along lines 8*a*-8*b*, 8*c*-8*d* and 8*e*-8*f* of FIGS. 8A, 8C and 8E and fabricated by an exemplary method in accordance with an embodiment of the present disclosure.
Figure 8C:
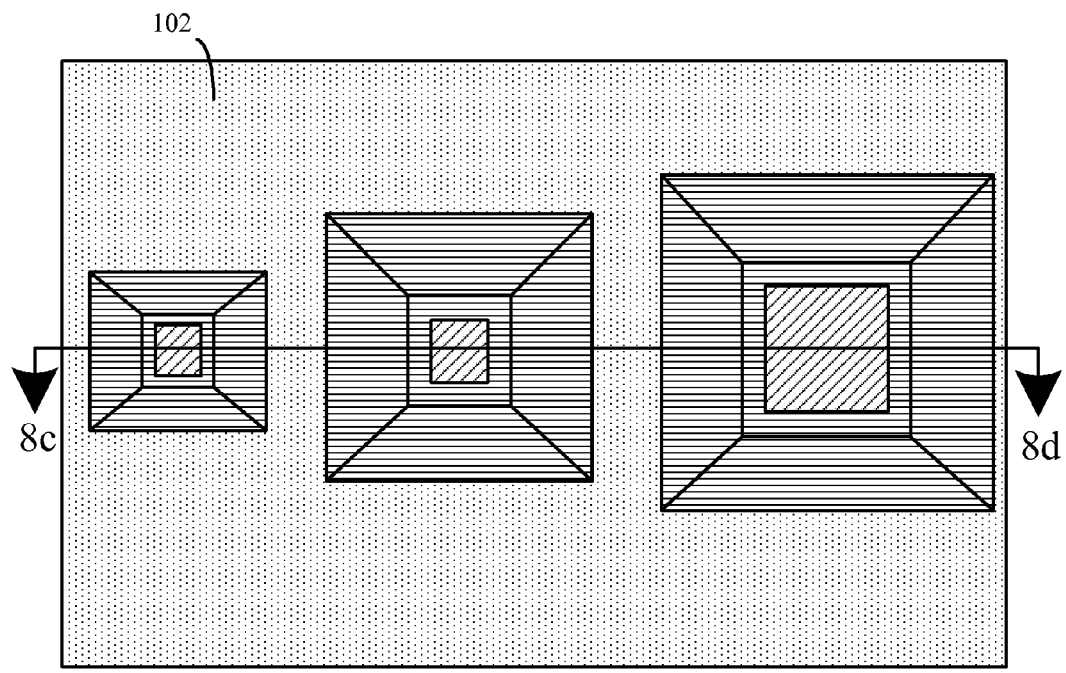
Figure 8D:
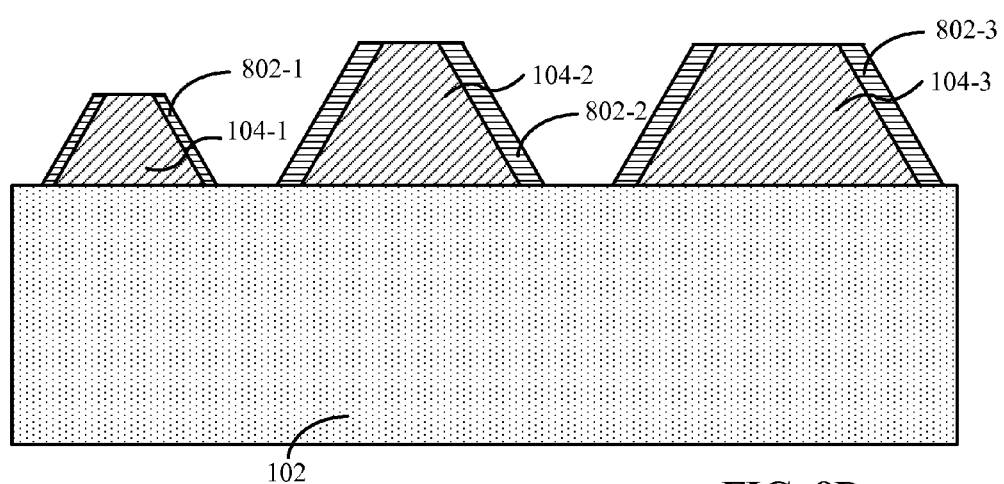
Figure 8E:
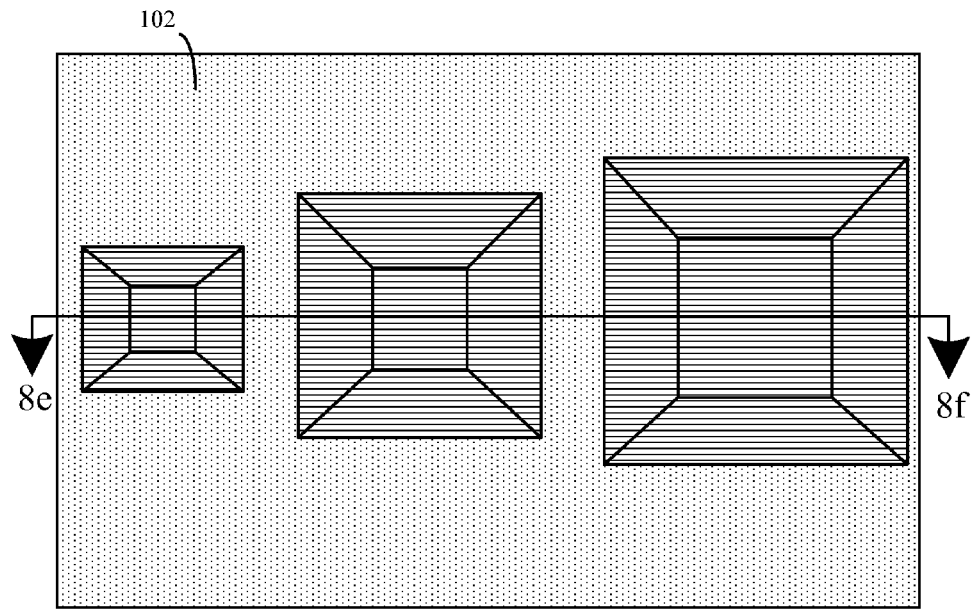

FIGS. 8A, 8C and 8E illustrate top views of an exemplary graphene device topography (e.g., elements along a row of an array formed as projections with shapes corresponding to frustums of pyramids on the substrate with one or more graphene stacks on respective top surfaces, side walls, and a combination thereof) fabricated by exemplary methods in accordance with an embodiment of the present disclosure.

Figure 8F:
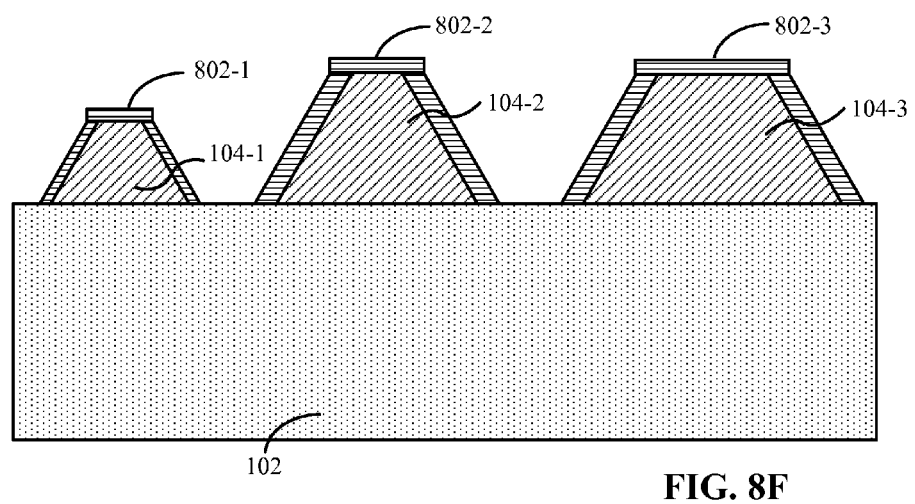
Figure 9C:
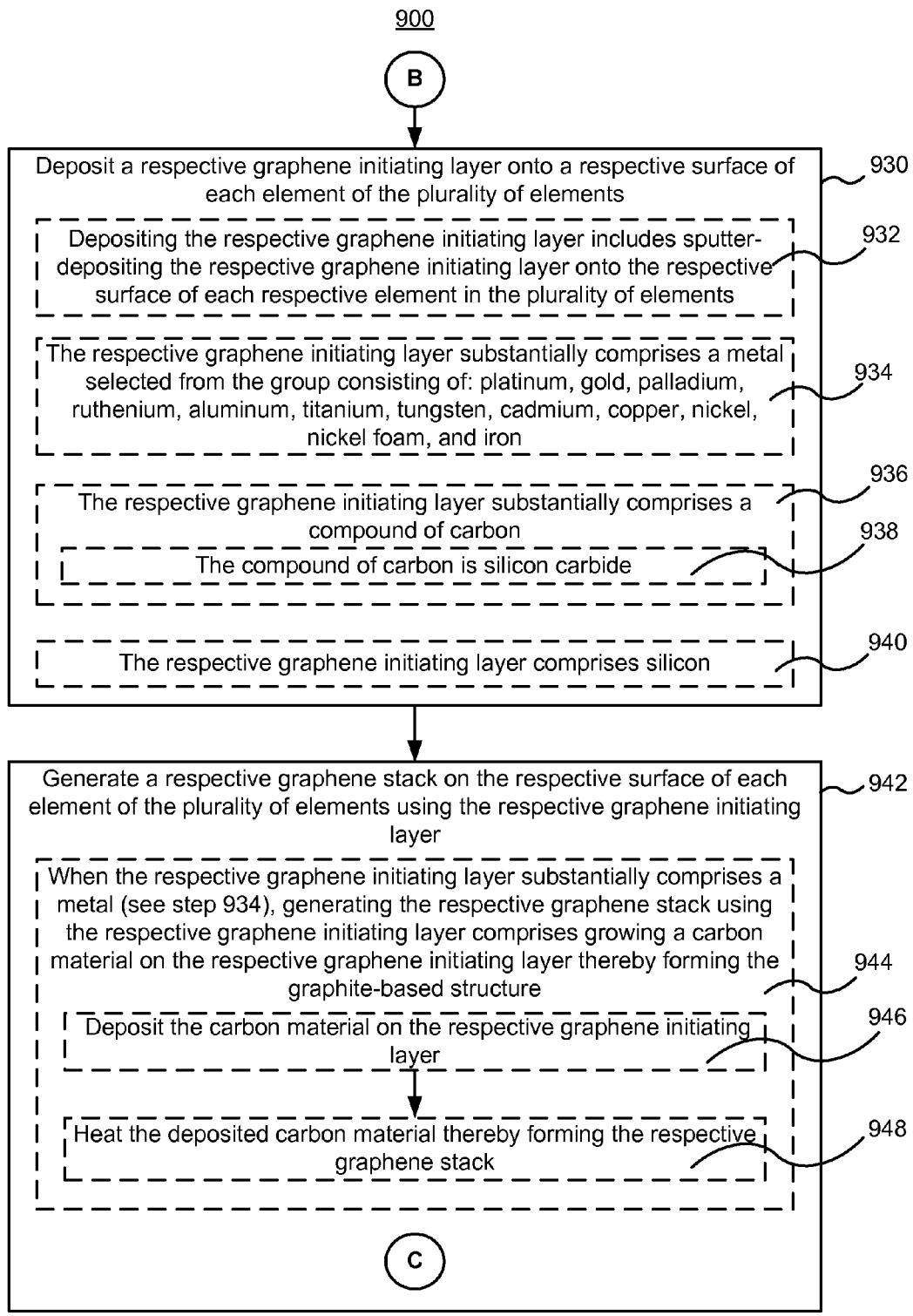
Figure 9E:
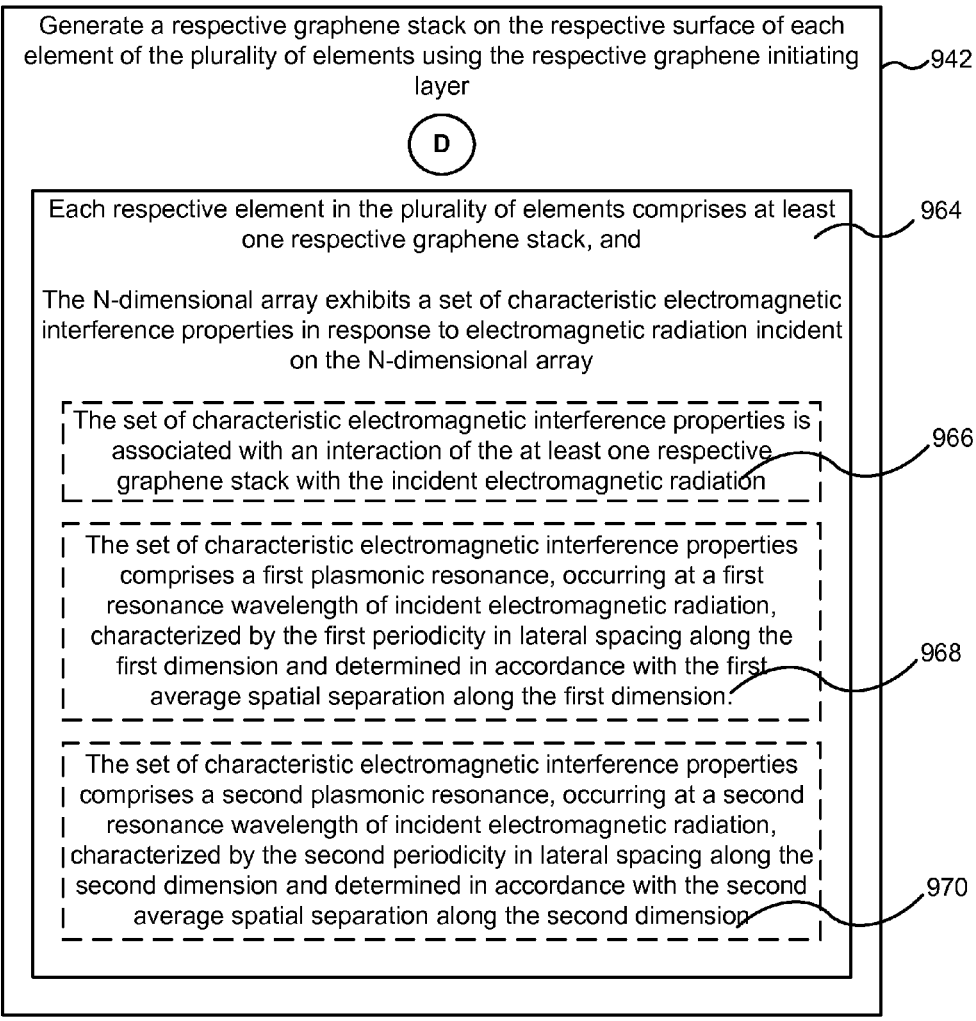

FIGS. 8B, 8D and 8F illustrate cross-sectional views of the exemplary graphene device topography taken along lines 8a-8b, 8c-8d and 8e-8f of FIGS. 8A, 8C and 8E and fabricated by an exemplary method in accordance with an embodiment of the present disclosure.

As shown in FIGS. 8A, 8C and 8E each respective element (e.g., 104-1, 104-2, 104-3) in the corresponding plurality of elements is a frustum of a pyramid. A base of the frustum is affixed to the surface of the substrate (e.g., substrate 102), the base being characterized by a first surface area and a first perimeter defining a first n-gon with n edges (e.g., a rectangle with 4 sides as shown in FIGS. 8A, 8C and 8E), where n in an integer of three or greater, and having a first average edge-length. A central axis of the frustum is defined substantially orthogonal to the lateral surface of the substrate between the respective base of the frustum and a respective top surface of the frustum.

A top surface of the frustum is distal to the native surface of the substrate, the top surface of the frustum being characterized by a second surface area and a second perimeter defining a second n-gon with N edges having a second average edge-length, the second surface area being less than the first surface area and the second average edge-length being less than the first average edge-length; and N respective faces of the frustum separating the respective base of the frustum from the respective top surface of the frustum and bounded by the N edges of the respective base of the frustum and the respective N edges of the respective top surface of the frustum.

As shown in FIG. 8B, in some embodiments, a first graphene stack (e.g., 802-1, 802-2, 802-3) in the at least one graphene stack is formed over the top surface of the frustum.

As shown in FIG. 8D, in some embodiments, the first graphene stack (e.g., 802-1, 802-2, 802-3) is formed over each of the N respective faces of the frustum.

As shown in FIG. 8F, in some embodiments, the first graphene stack (e.g., 802-1, 802-2, 802-3) is formed over the top surface of the frustum and over each of the N respective faces of the frustum.

In some embodiments, the first graphene stack is formed over one or more of: the top surface and the N respective faces of the frustum; a second graphene stack is formed over the surface of the substrate; the first graphene layer has a first set of properties and the second graphene stack has a second set of properties; and the first set of properties is distinct from the second set of properties.

In some embodiments, the first graphene stack is formed over one or more of: the top surface and the N respective faces of the frustum; and the set of characteristic electromagnetic interference properties is associated with an interaction of the first graphene stack with the incident electromagnetic radiation.

FIGS. 9A-9E illustrate a flow diagram representing exemplary process flow 900 for the fabrication of one or more graphene device topography in accordance with an embodiment of the present disclosure. As shown in FIGS. 9A-9E, the fabrication process flow 900 includes patterning (902) a substrate. In particular, the substrate is patterned to form an N-dimensional array of elements on a lateral surface of a substrate. The N-dimensional array includes a plurality of rows, each respective row in the plurality of rows comprises a plurality of elements formed along a first dimension characterized by an axis of the respective row, each respective element in the plurality of elements is separated from an adjacent element along the first dimension by a first average spatial separation, thereby resulting in a first periodicity in lateral spacing along the first dimension. Each respective row in the plurality of rows is separated from an adjacent row along a second dimension by a second average spatial separation, thereby resulting in a second periodicity in lateral spacing along the second dimension.

In some embodiments, the N-dimensional array is a linear array (e.g., with uniform spacing between consecutive elements and/or between consecutive rows) (904). In some embodiments, the N-dimensional array is a non-linear array (e.g., with non-uniform spacing between consecutive elements and/or between consecutive rows) (906). In some embodiments, the N-dimensional array comprises a substantially radial arrangement of the plurality of rows (e.g., with a predefined angle of separation between consecutive rows of the plurality of rows) (908). In some embodiments, the plurality of elements is formed by engraving (e.g., etching) a plurality of cavities into the substrate in a direction substantially orthogonal to the native lateral surface of the substrate (910). In some embodiments, the plurality of elements is formed by growing portions of substrate material or growing at least one respective secondary material selectively at regions of the substrate or the secondary material corresponding to the plurality of elements (912).

In some embodiments, the substrate substantially comprises a material selected from the group consisting of: neoceram, barosilicate glass, germanium arsenide, a IV-V semiconductor material, a substantially metallic material, a high temperature glass, and a combination thereof (914). In some embodiments, the substrate substantially comprises $SiO_2$ glass, soda lime glass, lead glass, doped $SiO_2$, aluminosilicate glass, borosilicate glass, dichroic glass, germanium/semiconductor glass, glass ceramic, silicate/fused silica, quartz or chalcogenide/sulphide glass (916).

In some embodiments, each respective element in the plurality of elements comprises a respective projection in a direction substantially orthogonal to the lateral surface of the substrate (918).

In some embodiments, each respective element in the plurality of elements comprises a corresponding cavity in a plurality of cavities engraved into the substrate in a direction substantially orthogonal to the native lateral surface of the substrate (920).

In some embodiments, each respective element in the plurality of elements comprises a plurality of contiguous cavities in the substrate in a direction substantially orthogonal to the native lateral surface of the substrate, and wherein the plurality of contiguous cavities is stacked contiguously along the direction substantially orthogonal to the lateral surface of the substrate (922).

In some embodiments, each respective element in the plurality of elements is a quantum dot formed on the native lateral surface of the substrate. The quantum dot further includes a respective graphene stack formed over the quantum dot to cover at least a portion of a metal-based graphene initiating material on a respective surface of the respective nodule distal from the lateral surface of the substrate (924).

In some embodiments, each respective element in the plurality of elements is a rib comprising a respective foundation material and a ratio of an average length of the rib to an average width of the rib has a value between 2 and 10 (926).

In some embodiments, each respective element in the plurality of elements is a frustum of a pyramid (928).

The method further includes depositing (930) a respective graphene initiating layer onto a respective surface of each element of the plurality of elements. In some embodiments, the depositing of the respective graphene initiating layer includes sputter-depositing the respective graphene initiating layer onto the respective surface of each respective element in the plurality of elements (932). In some embodiments, the respective graphene initiating layer substantially comprises a metal selected from the group consisting of: platinum, gold, palladium, ruthenium, aluminum, titanium, tungsten, cadmium, copper, nickel, nickel foam, and iron (934). In some embodiments, the respective graphene initiating layer substantially comprises a compound of carbon (936). In some embodiments, the respective graphene initiating layer comprises silicon (938).

The method further includes generating (942) a respective graphene stack on the respective surface of each element of the plurality of elements using the respective graphene initiating layer. In some embodiments, the respective graphene initiating layer substantially comprises a metal (see step 934), and generating the respective graphene stack using the respective graphene initiating layer comprises growing a carbon material on the respective graphene initiating layer thereby forming the graphite-based structure (944). In some embodiments the carbon material is deposited on the respective graphene initiating layer (946). In some embodiments the deposited carbon material is heated thereby forming the respective graphene stack (948). In some embodiments, when the respective graphene initiating layer substantially comprises a compound of carbon (see step 936), generating the respective graphene stack using the respective graphene initiating layer comprises heating the respective graphene initiating layer to vaporize an element other than carbon from the compound of carbon (950). In some embodiments, when the compound of carbon is silicon carbide (see step 938), generating the respective graphene stack using the respective graphene initiating layer comprises heating the silicon carbide to vaporize elemental silicon in the silicon carbide (952).

In some embodiments (954), when the respective graphene initiating layer comprises silicon (see step 940), generating the respective graphene stack using the respective graphene initiating layer comprises: (i) depositing elemental carbon on or into the respective silicon graphene initiating layer (956), e.g., by doping the respective silicon graphene initiating layer by implantation of the elemental carbon into the respective silicon graphene initiating layer (958), and (ii) converting the respective silicon graphene initiating layer into silicon carbide by enabling a chemical reaction of the respective silicon graphene initiating layer with the deposited elemental carbon (960), e.g., by heating the silicon carbide to vaporize the silicon from the silicon carbide by reverse epitaxy, thereby forming the respective graphene stack (962).

In some embodiments, each respective element in the plurality of elements comprises at least one respective graphene stack, and the N-dimensional array exhibits a set of characteristic electromagnetic interference properties in response to electromagnetic radiation incident on the N-dimensional array (964). In some embodiments, the set of characteristic electromagnetic interference properties is associated with an interaction of the at least one respective graphene stack with the incident electromagnetic radiation (966). In some embodiments, the set of characteristic electromagnetic interference properties comprises a first plasmonic resonance, occurring at a first resonance wavelength of incident electromagnetic radiation, characterized by the first periodicity in lateral spacing along the first dimension and determined in accordance with the first average spatial separation along the first dimension (968). In some embodiments, the set of characteristic electromagnetic interference properties comprises a second plasmonic resonance, occurring at a second resonance wavelength of incident electromagnetic radiation, characterized by the second periodicity in lateral spacing along the second dimension and determined in accordance with the second average spatial separation along the second dimension (970).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An integrated graphene-based structure comprising an N-dimensional array of elements formed on a surface of a substrate, wherein:
   (i) the N-dimensional array of elements includes a plurality of rows,
   (ii) each respective row in the plurality of rows comprises a corresponding plurality of elements formed along a first dimension, the first dimension characterized by an axis of the respective row, each element in the corresponding plurality of elements (a) comprising at least one graphene stack and (b) separated from an adjacent element along the first dimension by a first average spatial separation thereby resulting in a first periodicity in lateral spacing along the first dimension,
   (iii) each respective row in the plurality of rows is separated from an adjacent row along a second dimension by a second average spatial separation, thereby resulting in a second periodicity in lateral spacing along the second dimension, and
   (iv) the N-dimensional array exhibits a set of characteristic electromagnetic interference properties in response to electromagnetic radiation incident on the N-dimensional array, wherein:
   each respective element in the corresponding plurality of elements comprises a corresponding cavity in a plurality of cavities in the substrate;
   each respective cavity in the plurality of cavities includes (i) a corresponding trench surface formed on a surface of the cavity distal from the native surface of the substrate and (ii) a corresponding side wall formed between the native surface of the substrate and the corresponding trench surface of the cavity;
   for at least one row in the plurality of rows, a secondary layer is formed over the at least one graphene stack of one or more elements in the corresponding plurality of elements; and
   the secondary layer comprises a secondary material.

2. The structure of claim 1, wherein the corresponding side wall is formed at a predetermined angle to the corresponding trench surface of the cavity.

3. The structure of claim 2, wherein the predetermined angle has a value between 5° and 85° measured with reference to the corresponding trench surface of the cavity.

4. The structure of claim 1, wherein a graphene stack in the at least one graphene stack is formed on the corresponding side wall of the respective cavity.

5. An integrated graphene-based structure comprising an N-dimensional array of elements formed on a surface of a substrate, wherein:
   (i) the N-dimensional array of elements includes a plurality of rows,
   (ii) each respective row in the plurality of rows comprises a corresponding plurality of elements formed along a first dimension, the first dimension characterized by an axis of the respective row, each element in the corresponding plurality of elements (a) comprising at least one grapheme stack and (b) separated from an adjacent element along the first dimension by a first average spatial separation thereby resulting in a first periodicity in lateral spacing along the first dimension,
   (iii) each respective row in the plurality of rows is separated from an adjacent row along a second dimension by a second average spatial separation, thereby resulting in a second periodicity in lateral spacing along the second dimension, and
   (iv) the N-dimensional array exhibits a set of characteristic electromagnetic interference properties in response to electromagnetic radiation incident on the N-dimensional array, wherein:
   the plurality of elements includes a first element comprising a first graphene stack and a second element comprising a second graphene stack;
   the first element is characterized by a first width and the second element is characterized by a second width, wherein the first width is different from the second width; and
   a reference position of the first element is separated from a reference position of the second element by a first spatial separation.

6. The structure of claim 5, herein the set of characteristic electromagnetic interference properties comprises:
   a first elemental resonance, occurring at a first elemental wavelength of incident electromagnetic radiation, determined in accordance with the first lateral width of the first element and associated with an interaction of the first graphene stack with the incident electromagnetic radiation;

a second elemental resonance, occurring at a second elemental wavelength of incident electromagnetic radiation, determined in accordance with the second lateral width of the second element and associated with an interaction of the second graphene stack with the incident electromagnetic radiation; and a respective inter-elemental resonance, occurring at a third elemental wavelength of incident electromagnetic radiation, determined in accordance with the first spatial separation.

7. The structure of claim 6, wherein the first element comprises a first cavity in the substrate in a direction substantially orthogonal to the surface of the substrate and the second element comprises a second cavity in the substrate in the direction substantially orthogonal to the surface of the substrate.

8. The structure of claim 7, wherein:
the first cavity includes a first end proximal to the native surface of the substrate and a second end distal to the native surface of the substrate; and
the first graphene stack is formed on the second end of the first cavity.

9. The structure of claim 8, wherein:
a secondary layer is formed over the first graphene stack; and
the secondary layer comprises a secondary material.

10. The structure of claim 9, wherein the secondary layer is a passivation layer and the respective secondary material is a transmissive material.

11. The structure of claim 9, wherein the secondary layer comprises a waveguide guide tuned to a respective wavelength.

12. The structure of claim 11, wherein the secondary material comprises silicon nitride, silicon dioxide, titanium dioxide, tantalum oxide, hafnium oxide, or any combination thereof.

13. The structure of claim 9, wherein the secondary layer is an electrically isolating layer and the secondary material is a dielectric.

14. The structure of claim 9, wherein the secondary material comprises a transparent conductive oxide.

15. The structure of claim 9, wherein the secondary material comprises an electrically conductive material and the secondary layer is an interconnect lead to electrically connect a first conductive material with a second conductive material.

16. The structure of claim 9, wherein the N-dimensional array of elements forms a component of a DNA sequencing microcavity, a DNA sequencing nanocavity, a condenser lens, a flys eye lens, a diffraction area for optical absorption, or any combination thereof.

17. The structure of claim 16, wherein the secondary layer forms a component of the DNA sequencing microcavity, the DNA sequencing nanocavity, the condenser lens, the flys eye lens, or the diffraction area for optical absorption.

18. The structure of claim 8, wherein a second graphene stack is formed on the lateral surface of the substrate.

19. The structure of claim 18, wherein:
the first graphene stack has a first set of properties and the second graphene stack has a second set of properties; and
the first set of properties is distinct from the second set of properties.

20. The structure of claim 7, wherein:
the first element is adjacent to the second element;
the plurality of elements further includes a third element adjacent to the second element, wherein the third element comprises a third cavity characterized by a third lateral width, and wherein the third lateral width, the second lateral width, and the first lateral width are distinct from each other; and
the reference position of the second element is separated from a reference position of the third element by a second spatial separation.

21. The structure of claim 7, wherein the first cavity includes a first trench surface formed on a surface of the cavity distal from the native surface of the substrate and a first side wall is formed between the native surface of the substrate and the respective trench surface of the cavity.

22. The structure of claim 21, wherein the first side will is formed at a predetermined angle to the respective trench surface of the cavity.

23. The structure of claim 22, wherein the predetermined angle has a value between 5° and 85° measured with reference to the respective trench surface of the cavity.

24. The structure of claim 21, wherein the first graphene stack is formed on the first side wall of the first cavity.

25. The structure of claim 1, wherein the secondary layer is a passivation layer and the respective secondary material is a transmissive material.

26. The structure of claim 1, wherein the secondary layer comprises a waveguide guide tuned to a respective wavelength.

27. The structure of claim 1, wherein the secondary material comprises silicon nitride, silicon dioxide, titanium dioxide, tantalum oxide, hafnium oxide, or any combination thereof.

28. The structure of claim 1, wherein the secondary layer is an electrically isolating layer and the secondary material is a dielectric.

29. The structure of claim 1, wherein the secondary material comprises a transparent conductive oxide.

30. The structure of claim 1, wherein the secondary material comprises an electrically conductive material and the secondary layer is an interconnect lead to electrically connect a first conductive material with a second conductive material.

31. The structure of claim 1, wherein the N-dimensional array of elements forms a component of a DNA sequencing microcavity, a DNA sequencing nanocavity, a condenser lens, a flys eye lens, a diffraction area for optical absorption, or any combination thereof.

32. The structure of claim 1, wherein the secondary layer forms a component of the DNA sequencing microcavity, the sequencing nanocavity, the condenser lens, the flys eye lens, or the diffraction area for optical absorption.

* * * * *